(12) United States Patent
Shino

(10) Patent No.: US 6,965,147 B2
(45) Date of Patent: Nov. 15, 2005

(54) SEMICONDUCTOR DEVICE INCLUDING TRANSISTORS FORMED IN SEMICONDUCTOR LAYER HAVING SINGLE-CRYSTAL STRUCTURE ISOLATED FROM SUBSTRATE

(75) Inventor: Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 10/767,430

(22) Filed: Jan. 30, 2004

(65) Prior Publication Data

US 2005/0110078 A1  May 26, 2005

(30) Foreign Application Priority Data

Nov. 25, 2003  (JP) .............................. 2003-394321

(51) Int. Cl.$^7$ ............................................. H01L 27/01
(52) U.S. Cl. ...................... 257/347; 257/348; 257/349; 257/350; 257/351; 257/352; 257/353; 257/354; 257/507
(58) Field of Search ................................ 257/347, 348, 257/349, 350, 351, 352, 353, 354, 507

(56) References Cited

U.S. PATENT DOCUMENTS 6,194,289 B1 * 2/2001 Lee ............................ 438/450
6,646,305 B2 * 11/2003 Assaderaghi et al. ........ 257/347

OTHER PUBLICATIONS

T. Ohsawa, et al., International Solid-State Circuits Conference, pp. 152, 153 and 154, "Memory Design Using One-Transistor Gain Cell On Soi", 2002.

* cited by examiner

Primary Examiner—Andy Huynh
(74) Attorney, Agent, or Firm—Oblon, Spivak, McClelland, Maier & Neustadt, P.C.

(57) ABSTRACT

A semiconductor device includes a substrate, a semiconductor layer of a first conductivity type having a single-crystal structure, and a plurality of transistors each including a first gate electrode provided above the semiconductor layer with a first gate insulation film laid therebetween, a pair of impurity regions of a second conductivity type being provided in the semiconductor layer and each becoming a source or drain region, and a channel body of the first conductivity type provided in the semiconductor layer at a portion between these impurity regions. The device also includes a first gate line for common connection of the first gate electrodes of the transistors, a dielectric layer provided above the substrate in an extension direction of the first gate line, for supporting the semiconductor layer under the pair of impurity regions to thereby dielectrically isolate between the substrate and the semiconductor layer, a second gate electrode provided above the substrate in such a manner as to underlie the channel bodies of the transistors and oppose the channel bodies with a second gate insulation film laid therebetween, the second gate electrode having a gate length larger than a onefold value of a gate length of the first gate electrode and yet less than or equal to thrice the gate length, and a second gate line provided above the substrate along the extension direction of the first gate line while being placed between portions of the dielectric layer underlying the pair of impurity regions, the second gate line being for common connection of the second gate electrode.

16 Claims, 34 Drawing Sheets

SEMICONDUCTOR DEVICE INCLUDING TRANSISTORS FORMED IN SEMICONDUCTOR LAYER HAVING SINGLE-CRYSTAL STRUCTURE ISOLATED FROM SUBSTRATE

CROSS-REFERENCE TO PRIOR APPLICATION

This application is based upon and claims the benefit of priority from the prior Japanese Patent Application No. 2003-394321, filed on Nov. 25, 2003, the entire contents of which are incorporated herein by reference.

BACKGROUND OF THE INVENTION

1. Field of the Invention

The present invention relates to semiconductor devices having transistors formed on a semiconductor substrate such as a silicon-on-insulator (SOI) substrate and also to fabrication methods thereof.

2. Description of the Related Art

Semiconductor devices are such devices as metal oxide semiconductor (MOS) transistors formed on a semiconductor substrate. Examples of the semiconductor devices are logic circuits and memories such as dynamic random access memory (DRAM). Recently, there is proposed a semiconductor device performing dynamic memory by use of a simpler cell structure for the purpose of replacement of conventional DRAMs (see JP-A-2002-246571 (FIG. 25)). A memory cell is constituted from a single transistor having a floating body (channel body). This memory cell performs two-value storage while letting a state in which majority carriers are accumulated at the body be as a first data state (for example, logic "1" data) and letting a state in which the majority carriers are drawn out of the body be a second data state (e.g., data "0").

This type of memory cell is known as the "floating body cell (FBC)"; a semiconductor device using FBCs is called the "FBC memory." The FBC memory does not necessitate the use of any capacitors unlike ordinary DRAMs so that it offers advantages which follow: a memory cell structure is simple; a unit cell area stays less; and, for this reason, higher integration is made easier.

An SOI substrate is known as the substrate of a semiconductor device. FBCs are formed on an SOI substrate. The SOI substrate is structured so that a silicon layer with a single-crystal structure is disposed on or above a buried oxide layer that is formed on a "base" substrate. The substrate and the silicon layer are dielectrically separated or isolated from each other by the buried oxide layer. The use of such SOI substrate results in accomplishment of advantages such as speed-up of operating speeds, power saving abilities and others.

However, even in the case of using the SOI substrate, when MOS transistors are scaled down and miniaturized in size, a leakage current increases due to the presence of the so-called "short channel" effects. As a technique for avoiding this problem, a scheme is known for employing MOS transistors of the double gate type, which are structured so that the channel body of a transistor is sandwiched by two, upper and lower gate electrodes (see JP-A-14-57337 (FIG. 5)).

SUMMARY OF THE INVENTION

In accordance with one aspect of this invention, a semiconductor device comprises: a substrate; a semiconductor layer of a first conductivity type having a single-crystal structure; a plurality of transistors each including a first gate electrode provided above the semiconductor layer with a first gate insulation film laid therebetween, a pair of impurity regions of a second conductivity type being provided in the semiconductor layer and becoming a drain region and a source region, and a channel body of the first conductivity type provided in the semiconductor layer at a portion between these impurity regions; a first gate line for common connection of the first gate electrodes of the plurality of transistors; a dielectric layer provided above the substrate in an extension direction of the first gate line, for supporting the semiconductor layer under the pair of impurity regions to thereby dielectrically isolate between the substrate and the semiconductor layer; a second gate electrode provided above the substrate in such a manner as to underlie the channel bodies of the plurality of transistors and oppose the channel bodies with a second gate insulation film laid therebetween, the second gate electrode having a gate length larger than a onefold value of a gate length of the first gate electrode and yet less than or equal to thrice the gate length; and a second gate line provided above the substrate along the extension direction of the first gate line while being placed between portions of the dielectric layer underlying the pair of impurity regions, the second gate line being for common connection of a plurality of the second gate electrodes.

In accordance with another aspect of this invention, a semiconductor device comprises: a substrate; a semiconductor layer of a first conductivity type having a single-crystal structure; a plurality of transistors each including a first gate electrode provided above the semiconductor layer with a first gate insulation film laid therebetween, a pair of impurity regions of a second conductivity type being provided in the semiconductor layer and becoming a drain region and a source region, and a channel body of the first conductivity type provided in the semiconductor layer at a portion between these impurity regions; a first gate line for common connection of the first gate electrodes of the plurality of transistors; a dielectric layer provided above the substrate in an extension direction of the first gate line, for supporting the semiconductor layer under the pair of impurity regions to thereby dielectrically isolate between the substrate and the semiconductor layer; a second gate electrode provided above the substrate in such a manner as to underlie the channel bodies of the plurality of transistors and oppose the channel bodies with a second gate insulation film laid therebetween; a second gate line provided above the substrate along the extension direction of the first gate line while being placed between portions of the dielectric layer underlying the pair of impurity regions, the second gate line being for common connection of a plurality of the second gate electrodes; and an element isolation portion for insulative isolation between adjacent ones of the transistors, the element isolation portion having a bottom positioned at a lower level than the semiconductor layer.

In accordance with still another aspect of this invention, a semiconductor device comprises: a substrate; a semiconductor layer of a first conductivity type having a single-crystal structure; a plurality of transistors each including a first gate electrode provided above the semiconductor layer with a first gate insulation film laid therebetween, a pair of impurity regions of a second conductivity type being provided in the semiconductor layer and becoming a drain region and a source region, and a channel body of the first conductivity type provided in the semiconductor layer at a portion between these impurity regions; a first gate line for common connection of the first gate electrodes of the plurality of transistors; a dielectric layer provided above the substrate in an extension direction of the first gate line, for supporting the semiconductor layer under the pair of impurity regions to thereby dielectrically isolate between the substrate and the semiconductor layer; a second gate electrode provided above the substrate in such a manner as to underlie the channel bodies of the plurality of transistors and oppose the channel bodies with a second gate insulation film laid therebetween; and a second gate line provided above the substrate along the extension direction of the first gate line while being placed between portions of the dielectric layer underlying the pair of impurity regions, the second gate line being for common connection of a plurality of the second gate electrodes, wherein the semiconductor layer is such that a formation region of the channel body is less in thickness than a formation region of the impurity region.

In accordance with a further aspect of this invention, a method for fabricating a semiconductor device is provided, which device has a plurality of transistors each including a semiconductor layer of a first conductivity type having a single-crystal structure and being dielectrically isolated by a dielectric layer from a substrate, a first gate electrode provided over this semiconductor layer through a first gate insulation film, a pair of impurity regions of a second conductivity type provided in the semiconductor layer for use as a drain region and a source region, and a channel body of the first conductivity type as provided in the semiconductor layer at a location between these impurity regions, wherein the method comprises: forming an etching stopper having an opening at a crossing portion of a first gate line formation region in which a first gate line is formed for common connection of the first gate electrode and an element isolating portion formation region in which an element isolating portion is formed for insulative isolation of the plurality of transistors; etching the dielectric layer in a state that the etching stopper was formed in such a manner that part of the dielectric layer remains under the semiconductor layer in which the pair of impurity regions are to be formed and remains along an extension direction of the first gate line formation region to thereby form an etching region having a cavity at a location beneath a portion of the semiconductor layer whereat the channel body is to be formed along an extension direction of the first gate line formation region; forming a second gate insulation film in contact with a portion of the semiconductor layer exposed at the cavity; forming a second gate line for common connection of the second gate electrodes in the etching region along the extension direction of the first gate line formation region in such a manner that a second gate electrode is provided through the second gate insulation film; and forming in the first gate line formation region the first gate line for common connection of the first gate electrode in such a manner that the first gate electrode is positioned via the first gate insulation film over the semiconductor layer in which the channel body is formed.

DETAILED DESCRIPTION OF THE EMBODIMENTS

Figure 1:
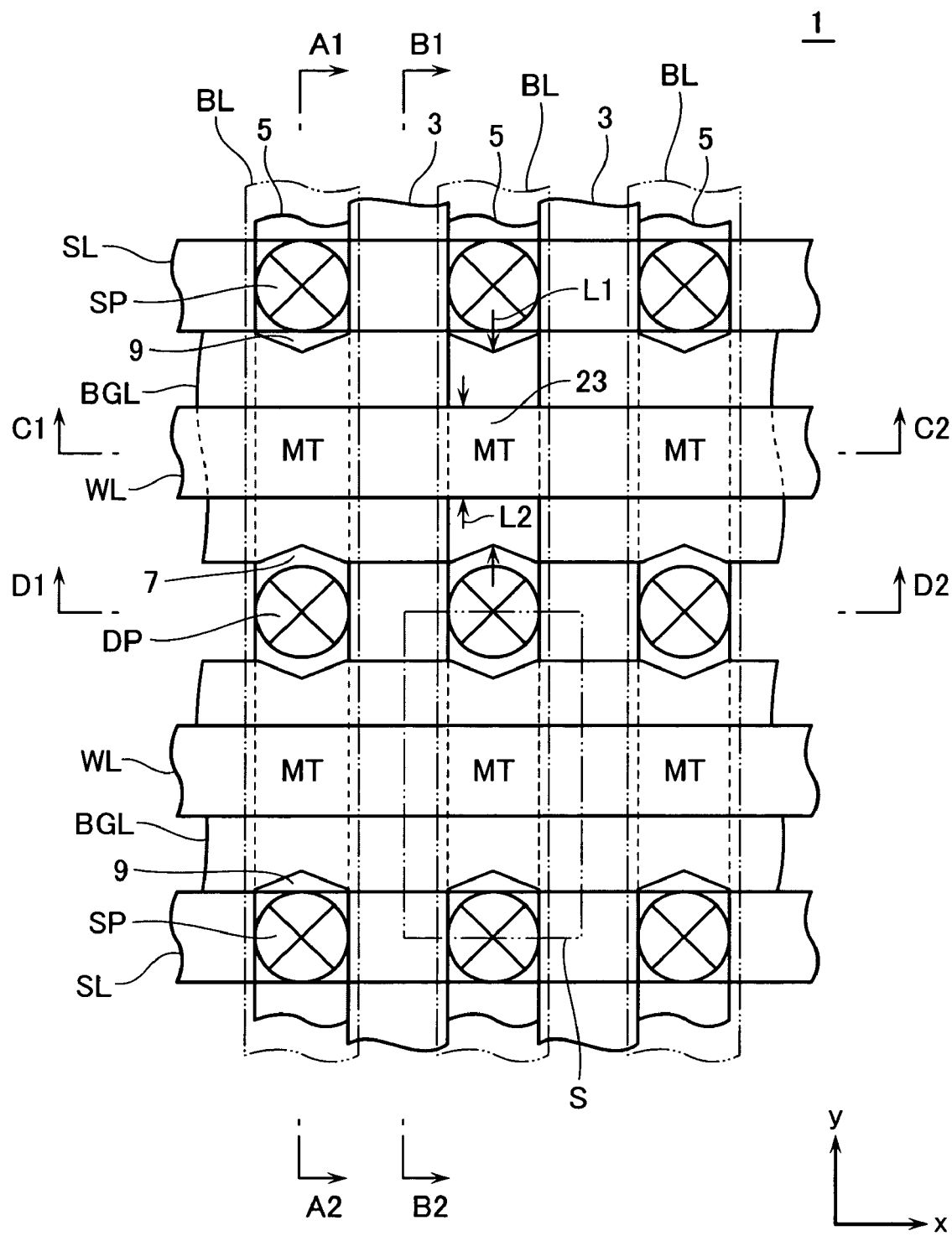
FIG. 1 is a diagram showing a plan view of part of a cell array of a semiconductor device in accordance with a first embodiment of the invention.

Embodiments of the present invention will be set forth below while dividing the description thereof into several sections which follow:

[First Embodiment]
(Structure of Semiconductor Device)
(Operation of Semiconductor Device)
(Back Gate Electrode)
(Main Effects of First Embodiment)
(Semiconductor Device Fabrication Method)
(Modified Layout of Semiconductor Device)
[Second Embodiment]

It should be noted that in the drawings for explanation of respective embodiments, like parts or components are designated throughout with like numerals or symbols, and repetitive explanations thereof are eliminated.

First Embodiment

A semiconductor device in accordance with a first embodiment is an FBC memory. A main feature of this semiconductor device is that it has a structure in which a back gate line extending in a word-line direction is placed between neighboring buried oxide layers that are laid out under a drain region and a source region and extend in the wordline direction. Note that in the first embodiment, a memory transistor functioning as a memory cell means an FBC.

(Structure of Semiconductor Device)

FIG. 1 is a diagram showing a plan view of part of a cell array 1 of the semiconductor device in accordance with the first embodiment. The cell array 1 is structured from a plurality of memory transistors MT (or storage transistors MT) which are arranged in a matrix form. A memory transistor MT stores data based on a state of majority carrier accumulated in a channel body that is in an electrically floating state. A layout of the cell array 1 will be explained in detail below.

The cell array 1 has a plurality of isolation portions 3 (or element isolation portions 3) which extend in a "y" direction, wherein these are disposed with an interval or spacing provided between neighboring ones. A region between isolators 3 is for use as a device formation region 5 (or element formation region 5). In the device formation region 5, a pair of impurity regions are formed, one of which is for use as a drain region 7 and the other of which becomes a source region 9.

In the cell array 1, a plurality of word lines WL (one example of first gate lines) are laid out so that these extend in an "x" direction to cross over the isolation portions 3 while providing an interval between adjacent word lines. A memory transistor MT is disposed at a portion at which a word line WL and a device formation region 5 cross or "intersect" together. Provided under the word lines WL are back gate lines (one example of second gate lines) BGL which extend in the x direction—that is, in the direction along which wordlines WL extend.

A memory transistor MT commonly uses or "shares" a drain region 7 with one of its neighboring memory transistors MT on the both sides in the y direction, while the memory transistor MT and the other of its neighboring transistors MT share a source region 9. A drain plug DP is connected to the drain region 7. This plug DP is connected to a bit line BL extending in the y direction. Accordingly, the bitline BL crossing wordlines WL is connected to the drain region 7. On the other hand, a source plug SP is connected to the source region 9; this plug SP is coupled to a source line SL extending in the x direction. Thus, the source line SL which is provided along the extension direction of wordlines WL is coupled to the source region 9.

An explanation will next be given of a cross-sectional structure of the cell array in accordance with the first embodiment with reference to FIGS. 2A, 2B, 2C and 2D. FIGS. 2A, 2B, 2C and 2D are sectional views as taken along lines A1–A2, B1–B2, C1–C2 and D1–D2, respectively.

The memory transistors MT are N-channel MOS (NMOS) transistors each having a floating channel body. Memory transistors MT are formed on an SOI substrate 17, which is generally structured from a lamination of a silicon substrate 11 (one example of the substrate), a buried oxide layer 13 (an example of dielectric layer), and a p-type silicon layer 15 with a single-crystal structure (an example of semiconductor layer).

The individual memory transistor MT has a drain region 7 and a source region 9 which are a pair of impurity regions formed in the silicon layer 15, a p-type channel body 19 provided in silicon layer 15 at a location midway between these regions 7 and 9, and a front gate electrode (one example of first gate electrode) 23, which is formed over the channel body 19 with a first gate insulation film 21 laid therebetween and which is connected to a wordline WL. Note here that the first gate insulation film 21 may also be called a front gate insulation film.

Certain portions (see FIG. 1) of the wordlines WL which cross the device formation regions 5 become front gate electrodes 23. Memory transistors MT with front gate electrodes 23 commonly coupled together by a wordline WL are dielectrically isolated by an isolator 3 from each other.

A channel body 19 is a floating body. A memory transistor MT stores either one of a first data state in which the channel body 19 retains a certain amount of majority carriers and a second data state in which channel body 19 holds a less amount of majority carriers than those in the first data state.

The buried oxide layer 13 underlies the drain region 7 and source region 9, and is provided on the silicon substrate 11 along the extension direction of the wordlines WL of FIG. 1. With such an arrangement, the buried oxide layer 13 provides dielectric isolation between the silicon layer 15 and silicon substrate 11 while at the same time supporting silicon layer 15.

A portion of the buried oxide layer 13 underlying the channel body 19 is removed away. At this portion a back gate electrode (one example of second gate electrode) 25 is disposed. The back gate electrode 25 opposes the channel body 19 at a location under channel body 19, with a second gate insulation film 27 sandwiched therebetween, and is positioned on the silicon substrate 11 through a silicon oxide film 29 which is simultaneously formed during formation of the second gate insulation film 27. Back gate electrode 25 has a cavity or void 31 at its central portion. This is the one that is created at the time of forming an amorphous silicon film for the back gate electrode 25. Note that the second gate insulation film 27 may alternatively be called a back gate insulator film.

Back gate lines BGL are disposed above the silicon substrate 11 along the extension direction of the wordlines WL in such a manner that a back gate line is laterally sandwiched or "interposed" between a buried oxide layer 13 under drain region 7 and a buried oxide layer 13 beneath source region 9. This line BGL is connected to silicon substrate 11 at a part underlying the isolator 3. By the back gate line BGL, back gate electrodes 25 of those memory transistors MT belonging to the same row are common-coupled together.

A silicide 33 is formed on drain regions 7 and source regions 9, while a silicide 35 is formed on front gate electrodes 23. Each front gate electrode 23 has its side faces on which sidewalls 37 are formed. A silicon nitride film 39 is formed on the silicides 33 and 35 to cover the memory transistors MT.

An interlayer dielectric film 41 is formed on the silicon nitride film 39. Source plugs SP connected to source regions 9 and lower portions 43 of drain plugs DP coupled to drain regions 7 are buried in the interlayer dielectric film 41, respectively. The interlayer dielectric film 41 is covered with an interlayer dielectric film 45. Source lines SL for connection to the source plugs SP are buried in the interlayer dielectric film 45. Also buried in this film 45 is an intermediate portion 47 of the individual drain plug DP for connection with the lower portion 43 thereof.

An interlayer dielectric film 49 is formed on the interlayer dielectric film 45. An upper portion 51 of each drain plug DP for connection to the intermediate portion 47 thereof is buried in the interlayer dielectric film 49. The drain plug DP consists essentially of the lower portion 43, intermediate portion 47 and upper portion 51. A bit line BL that is connected to the drain plug DP is formed on interlayer dielectric film 49.

Figure 3:
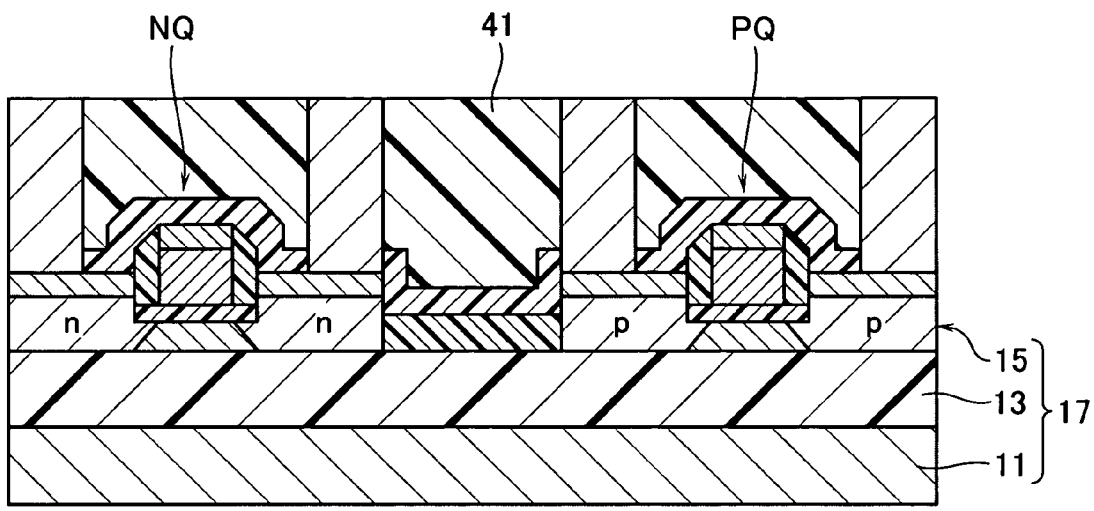
FIG. 3 is a sectional view of transistors for use as constituent elements of a logic circuit which is mounted together with the semiconductor device of the first embodiment.

Additionally, together with FBC memory, a logic circuit may also be mounted mixedly on the SOI substrate 17. FIG. 3 is a cross-sectional view of a PMOS transistor PQ and an NMOS transistor NQ which are for use as constituent components of this logic circuit. These logic transistors are formed in the silicon layer 15.

Figure 2A:
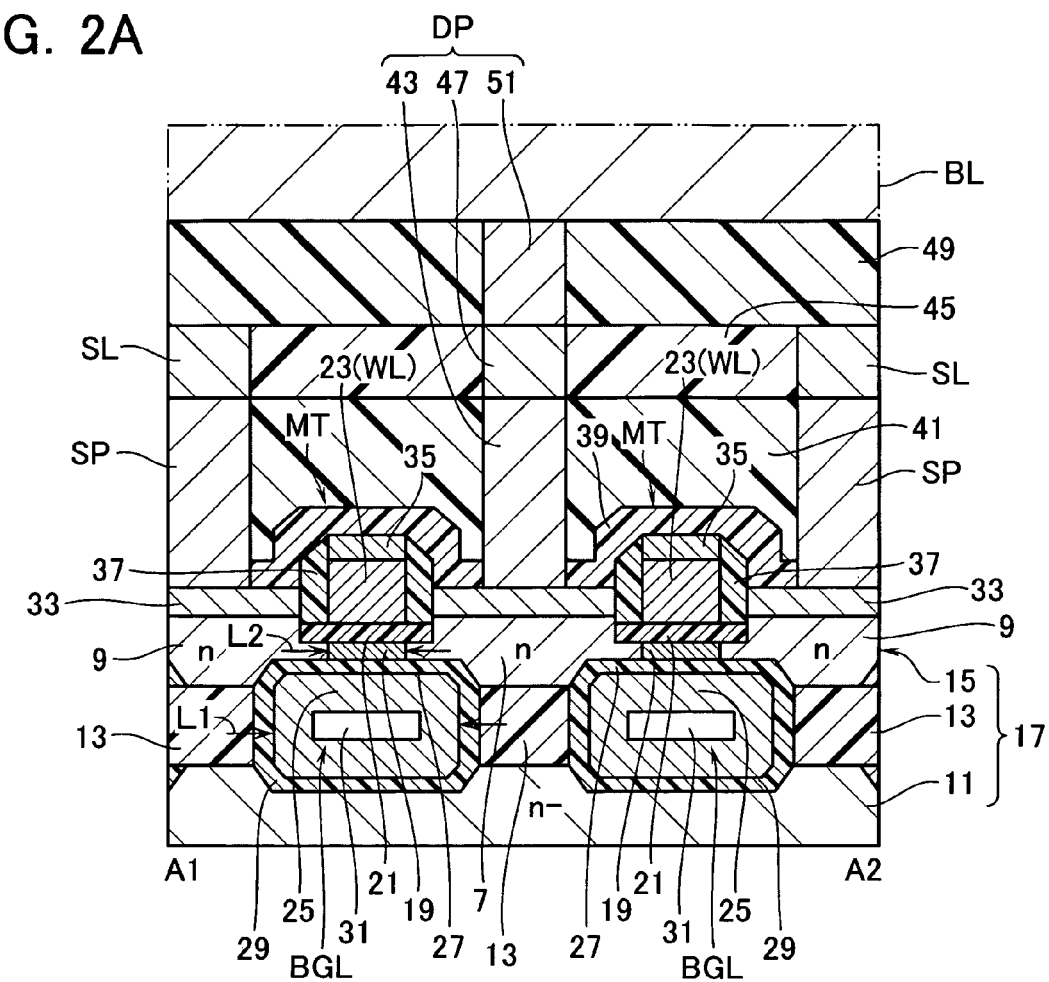
FIG. 2A is a cross-sectional diagram of the device as taken along line A1–A2 of FIG. 1.

In a formation area of the logic transistors, a relatively thick buried oxide layer 13 is used to lessen a parasitic capacitance between the silicon substrate 11 and silicon layer 15. This permits achievement of high-speed logic circuitry with low power consumption. On the other hand, the back gate electrode 25 is formed in the formation area of memory transistor MT as shown in FIG. 2A so that it is possible to realize an improved memory transistor MT with a long data retention time, as will be explained in the section of (Back Gate Electrode) to be later described.

(Operation of Semiconductor Device)

Figure 4:
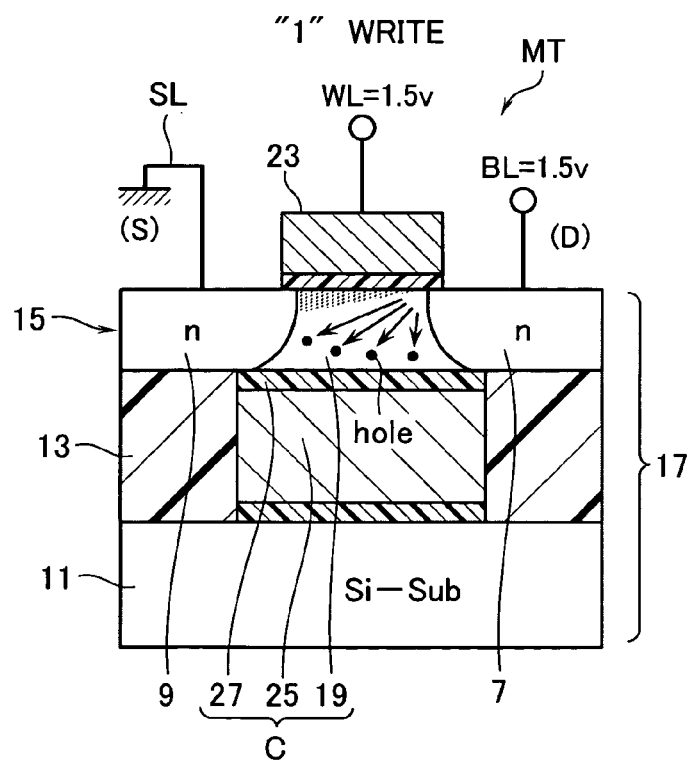
FIG. 4 is a diagram for explanation of a logic "1" writing operation of a memory transistor in accordance with the first embodiment.
Figure 5:
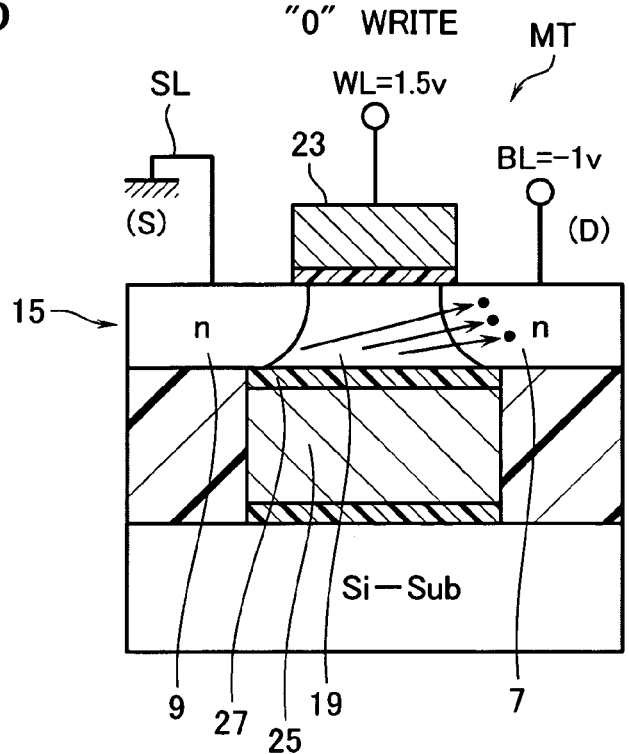
FIG. 5 is a diagram used to explain a logic "0" write operation of the memory transistor.
Figure 6:
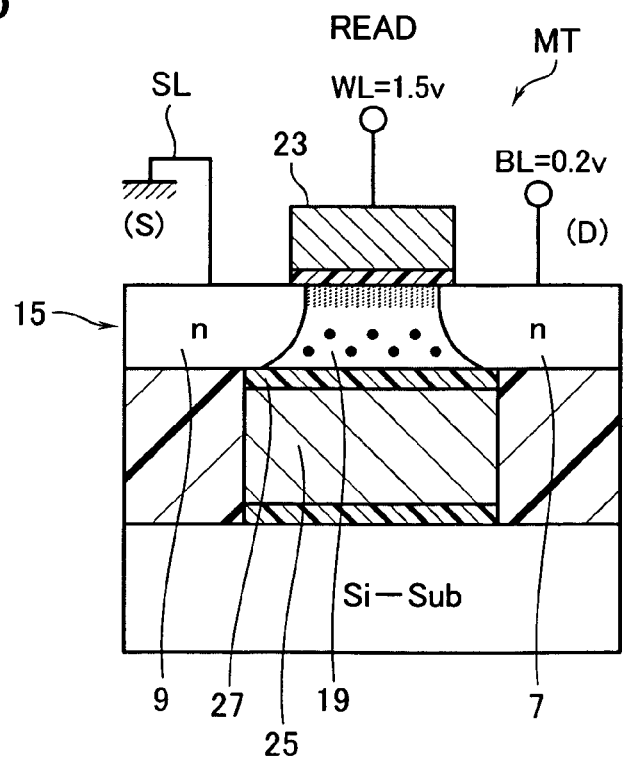
FIG. 6 is a diagram for explanation of a read operation of the memory transistor.

An operation of the semiconductor device will be explained with reference to FIGS. 4 to 6. FIGS. 4–6 are diagrams each showing a pictorial representation of a cross-section of memory transistor MT. FIG. 4 shows an operation for writing a logic "1" data; FIG. 5 shows a data "0" write operation; and, FIG. 6 shows a data read operation.

As shown in FIG. 4, when writing a logic "1" data into the memory transistor MT, specific bias conditions are given thereto which permit flow of a large channel current in memory transistor MT. For example, a voltage of 1.5 volts (V) is applied to a word line WL while applying a 1.5V voltage to a bit line BL. Whereby, majority carriers (in the example of FIG. 7, holes) are generated due to impact ionization at or near a drain region 7 and accumulated in a channel body 19.

Alternatively in the case of writing data "0," as shown in FIG. 5, 1.5V is applied to the word line WL while applying −1V to the bit line BL, by way of example. This voltage application causes a PN junction between the drain region 7 and channel body 19 to be set in a forward bias state, resulting in the majority carriers of body 19 being drawn out toward the drain region 7 side.

A difference in carrier storage state of the body 19 appears as a difference in threshold voltage of the memory transistor MT. Thus it is possible to perform readout of a logic "0" or "1" data by detecting or sensing whether a cell current is present (large) or absent (small) while giving 1.5V to the wordline WL and 0.2V to the bitline BL, for example.

Figure 7:
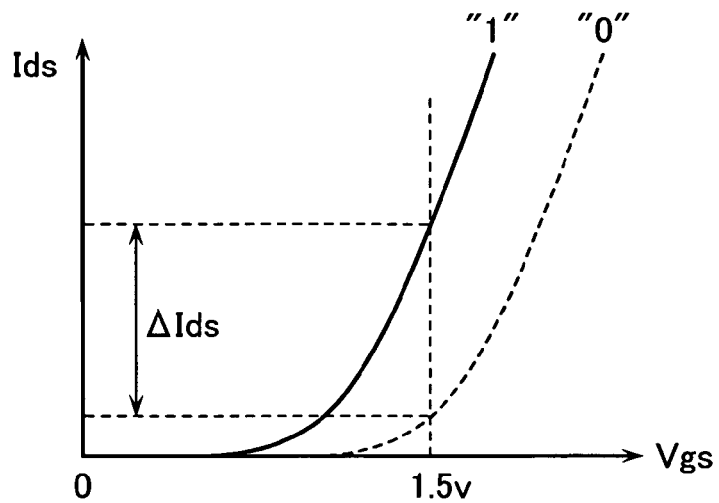
FIG. 7 is a diagram showing voltage versus current characteristics of the memory transistor.

FIG. 7 shows drain current Ids versus gate voltage Vgs characteristics curves of a memory transistor MT with respect to data "0" and "1." Recall here that the amount of majority carriers of the channel body 19 is changed due to the PN junction current between the channel body 19 and the drain region 7, source region 9 after elapse of a long time. Accordingly, it is required to perform refresh operations at constant time intervals in a similar way to that in conventional DRAMs.

(Back Gate Electrode)

Figure 2B:
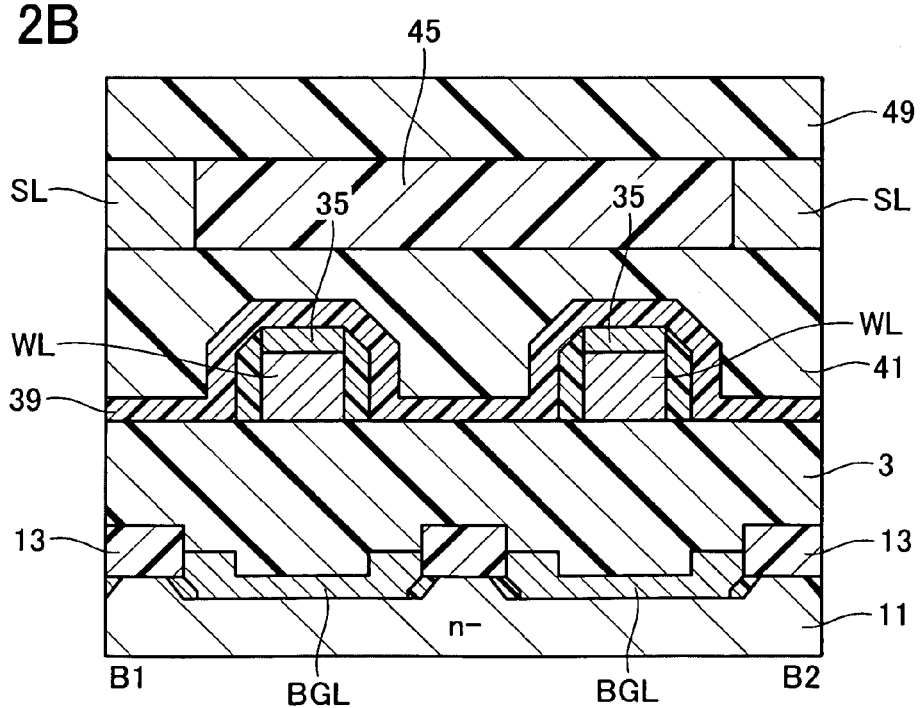
FIG. 2B is a sectional view of the device taken along line B1–B2 of FIG. 1.
Figure 2C:
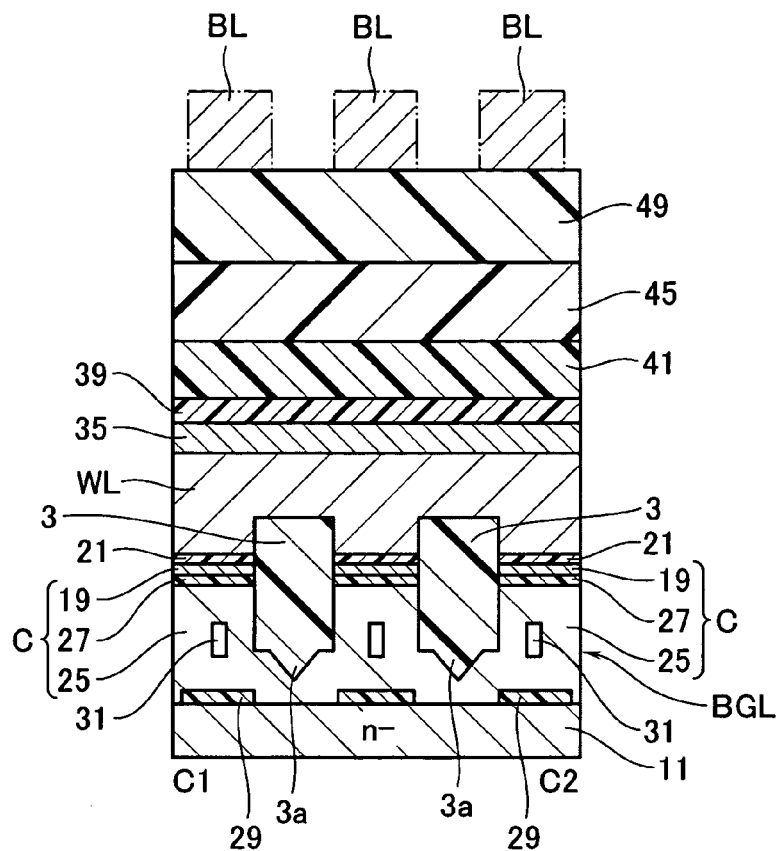
FIG. 2C is a sectional view taken along line C1–C2 of FIG. 1.
Figure 2D:
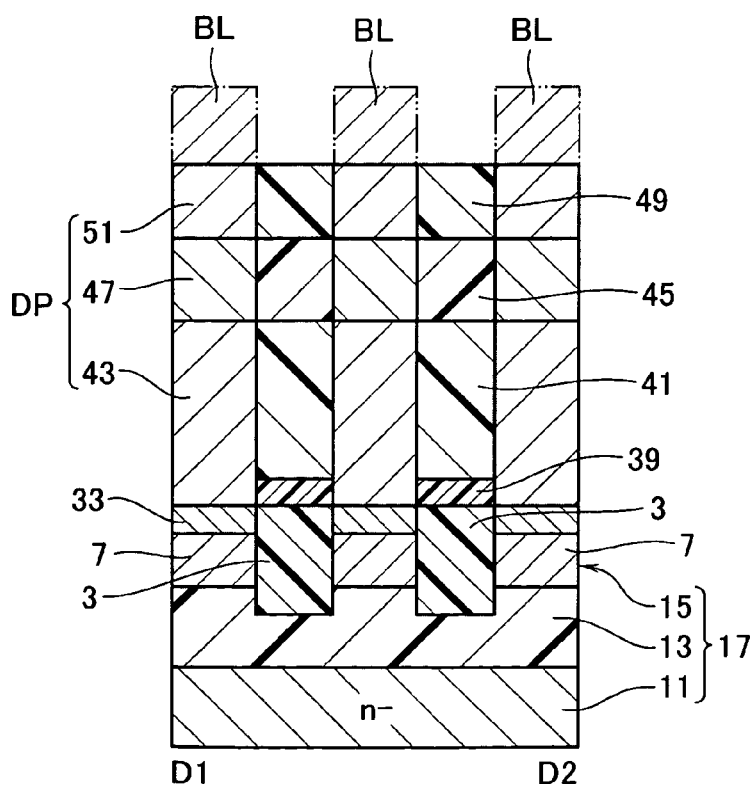
FIG. 2D is a sectional view along line D1–D2 of FIG. 1.

As shown in FIG. 2C and FIG. 4, a capacitor C is made up of a back gate electrode 25, second gate insulation film 27 and channel body 19. Owing to the capacitor C, holes storable at the channel body 19 increase in number. Whereby, data retention time of the memory transistor MT likewise increases. And, in the event of an operation of the semiconductor device, the back gate electrode 25 is potentially fixed or "pinned" to −2V, as an example. This facilitates accumulation of the holes at the capacitor C. In this way, the back gate electrode 25 is set at a prespecified potential level: a voltage required therefor is supplied from a wiring layer via back gate line BGL. There are two forms of a connection part of the back gate line and wiring layer, which are explained as follows.

Figure 8:
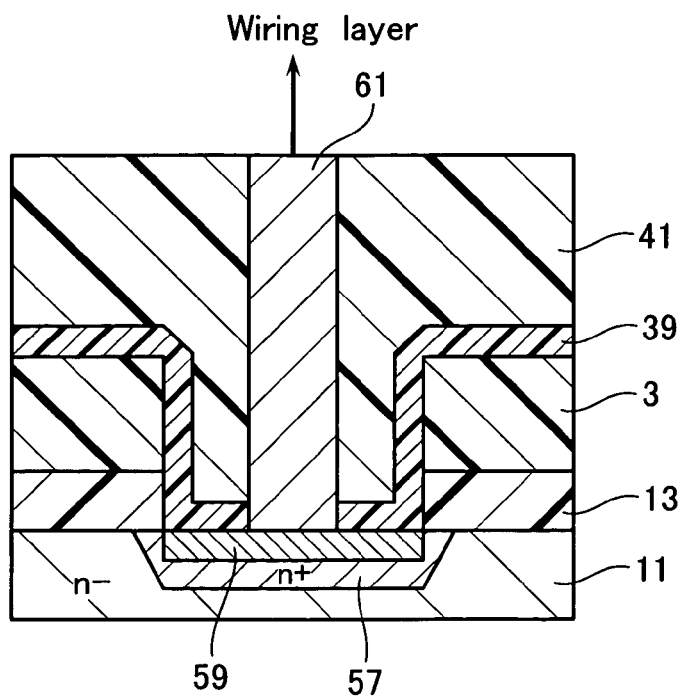
FIG. 8 is a cross-sectional view of one example of a connection portion between a back gate electrode and a wiring layer in accordance with the first embodiment.

The first one will be explained using FIG. 8. FIG. 8 is a cross-sectional view of the connection part of a back gate line and wiring layer. A n⁻-type diffusion layer is formed in the silicon substrate 11 in a certain surface area in which the cell array is formed. At this connection part, an n⁺-type diffusion layer 57 is formed in a surface of silicon substrate (n⁻-type diffusion layer) 11, while a silicide 59 is formed in a surface of diffusion layer 57. The buried oxide layer 13 and isolator 3 are not provided at portions overlying the diffusion layer 57 and silicide 59; instead, the interlayer dielectric film 41 is provided with a silicon nitride film 39 sandwiched therebetween. A plug 61 is buried in interlayer dielectric film 41 and silicon nitride film 39. Plug 61 is connected to a wiring layer (not shown) on its upper end side. A lower end of plug 61 is in contact with silicide 59.

On the other hand, as shown in FIGS. 1 and 2A–2B, the back gate electrode 25 is connected to a back gate line BGL, wherein this line BGL is in contact with the silicon substrate (n⁻-type diffusion layer) 11. Accordingly, respective back gate lines BGL are common-coupled to the plug 61 through the silicon substrate (n⁻-type diffusion layer) 11, n⁺-type diffusion layer 57 and silicide 59.

Figure 9:
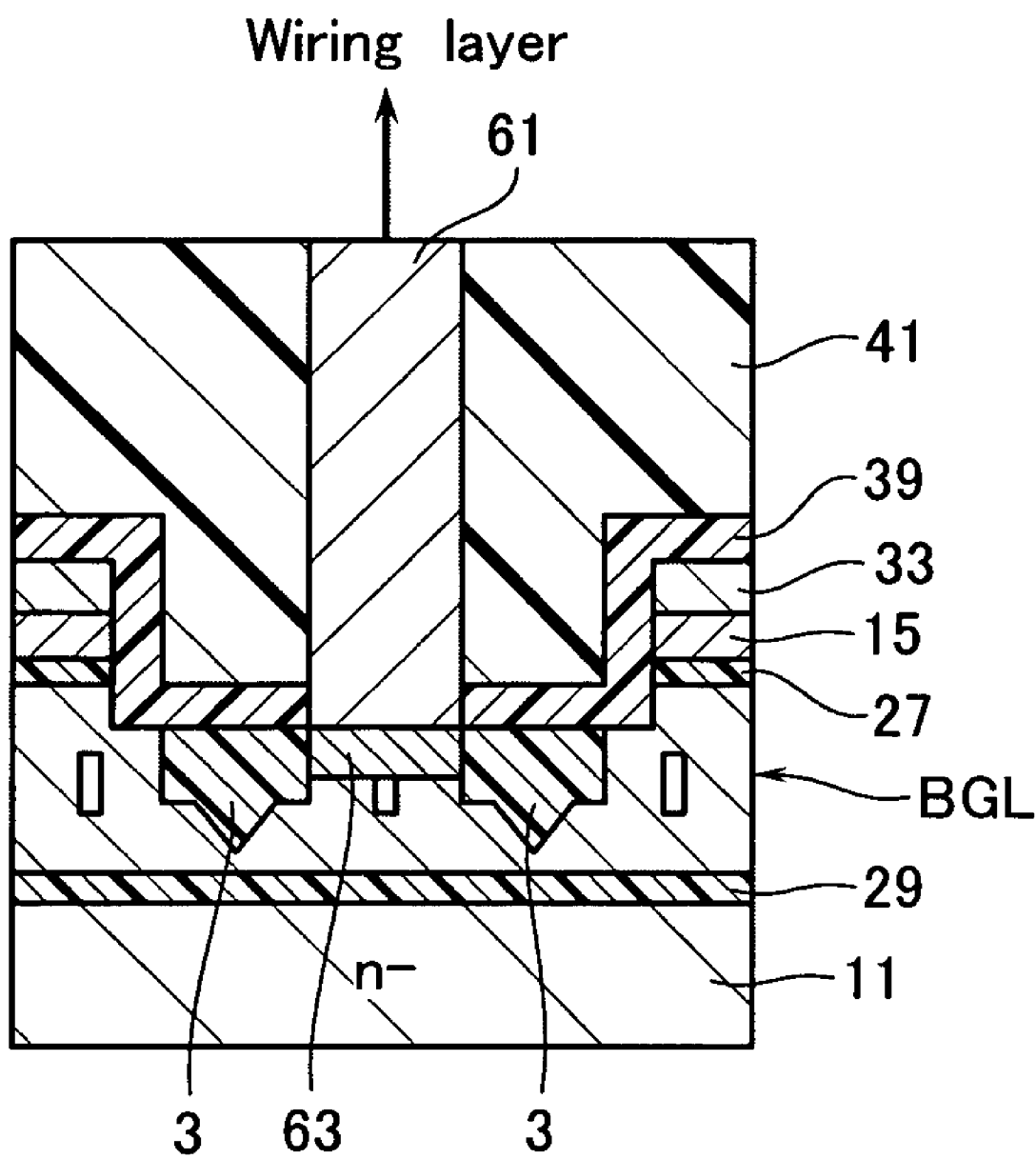
FIG. 9 is a sectional view of another example of the connection portion of the back gate electrode and wiring layer in accordance with the first embodiment.

Next, the second form will be explained in conjunction with FIG. 9. FIG. 9 is a sectional diagram of a connection part of a back gate line and wiring layer. In the first form stated supra, the potential of each back gate line BGL cannot be controlled in a way independent of the others due to the common connection of respective back gate lines BGL to the plug 61. In contrast, the second one is arranged to make it possible to potentially control each back gate line BGL independently. A detailed explanation of it will be given below.

First, within the cell array, unlike the structures shown in FIGS. 2B and 2C, each back gate line BGL is dielectrically isolated by a silicon oxide film 29 from the silicon substrate 11. Although not specifically depicted in FIG. 1, above each back gate line BGL, there is a portion at which a word line WL is segmented (or alternatively, a region in which any wordline WL is not disposed is provided at a certain portion of the cell array which overlies each back gate line BGL, although not shown in FIG. 1). This portion becomes the connection part of FIG. 9. At this connection part, the silicide 33 and silicon layer 15 are not formed. The lower end of plug 61 is in contact with a silicide 63 that is formed at back gate line BGL.

As apparent from the foregoing discussion, the back gate lines BGL and plugs 61 are arranged so that these are dielectrically isolated from the silicon substrate 11 while at the same time letting each back gate line BGL be connected to a different plug 61. With such an arrangement, it is possible to control the potential of each back gate line BGL independently.

(Main Effects of First Embodiment)

Figure 10:
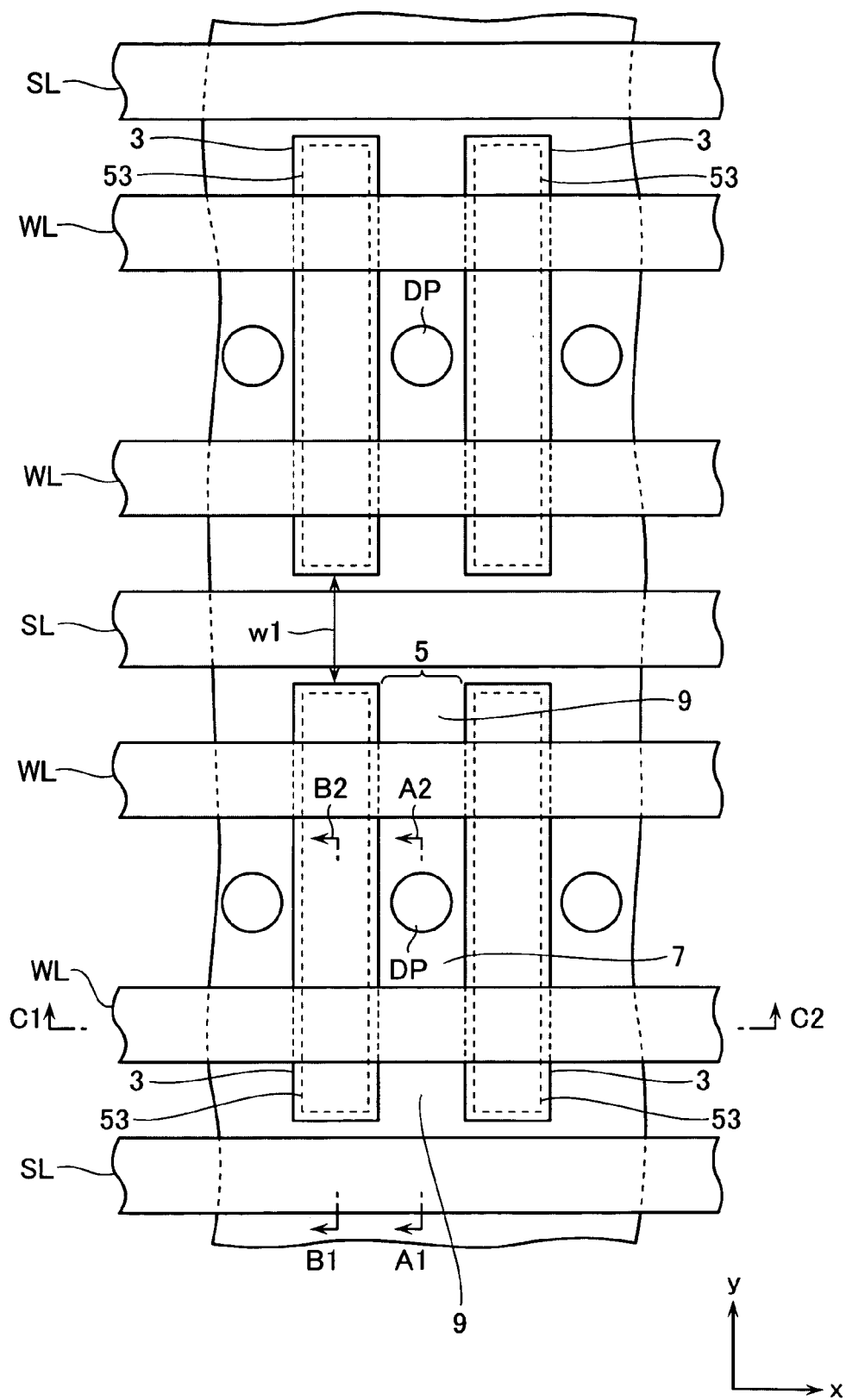
FIG. 10 is a plan view of part of a cell array in accordance with a first example for comparison use.
Figure 11:
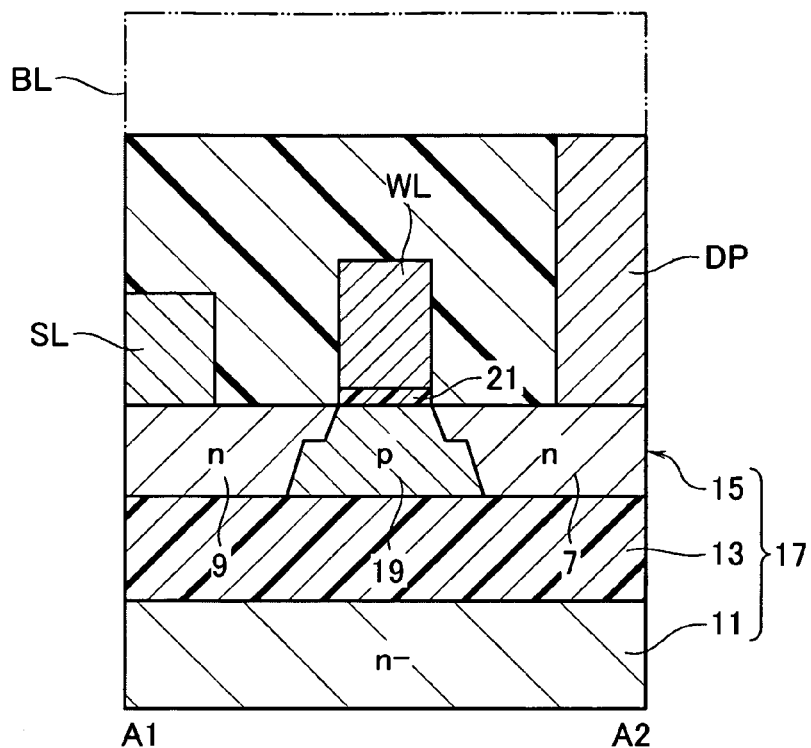
FIG. 11 is a cross-sectional diagram as taken along line A1–A2 of FIG. 10.
Figure 12:
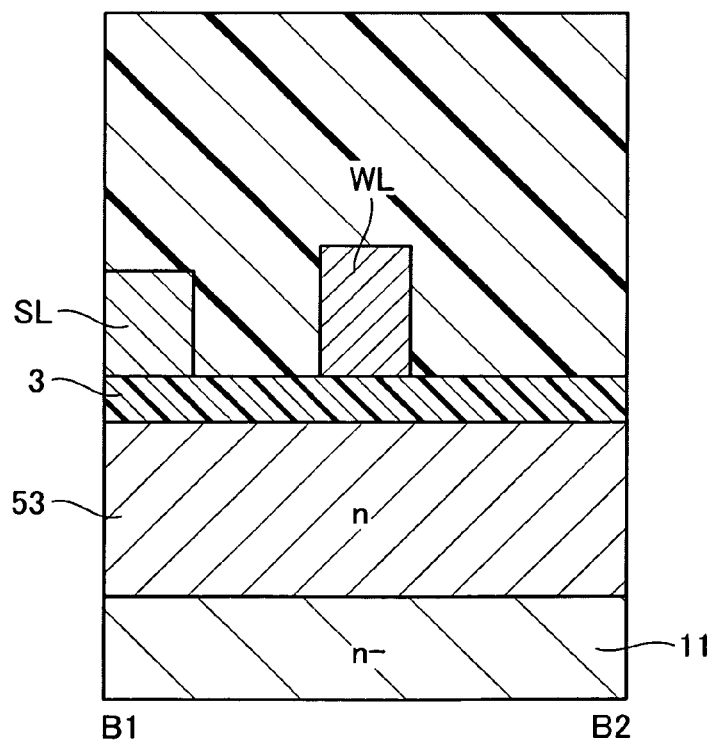
FIG. 12 is a sectional view taken along line B1–B2 of FIG. 10.
Figure 13:
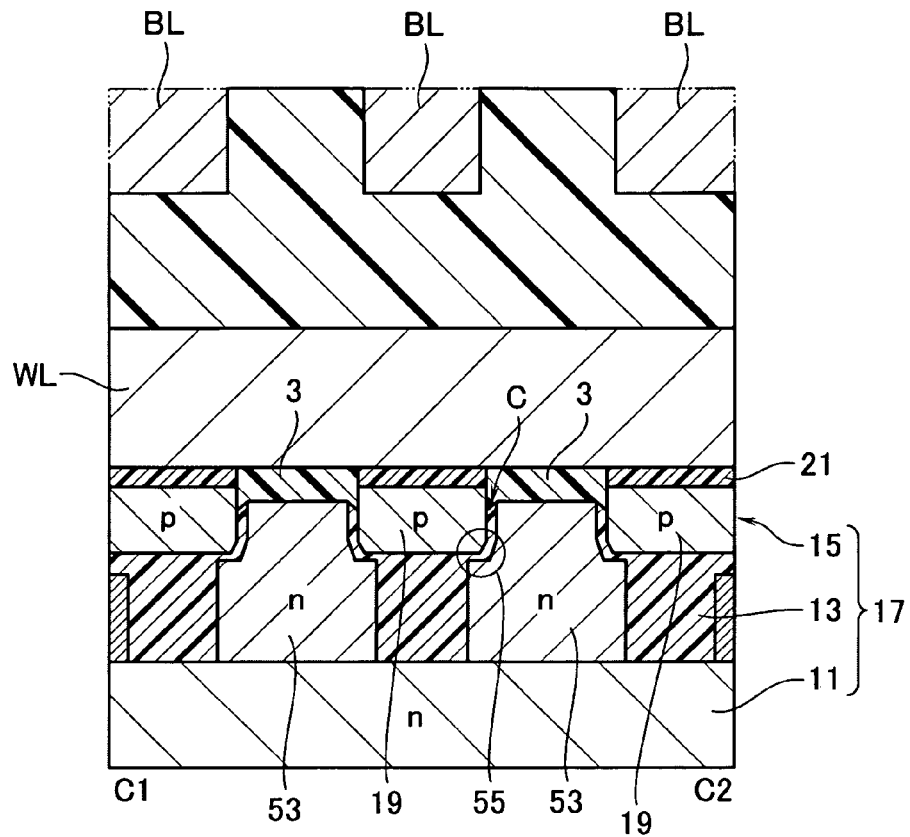
FIG. 13 is a cross-section along line C1–C2 of FIG. 10.
Figure 14:
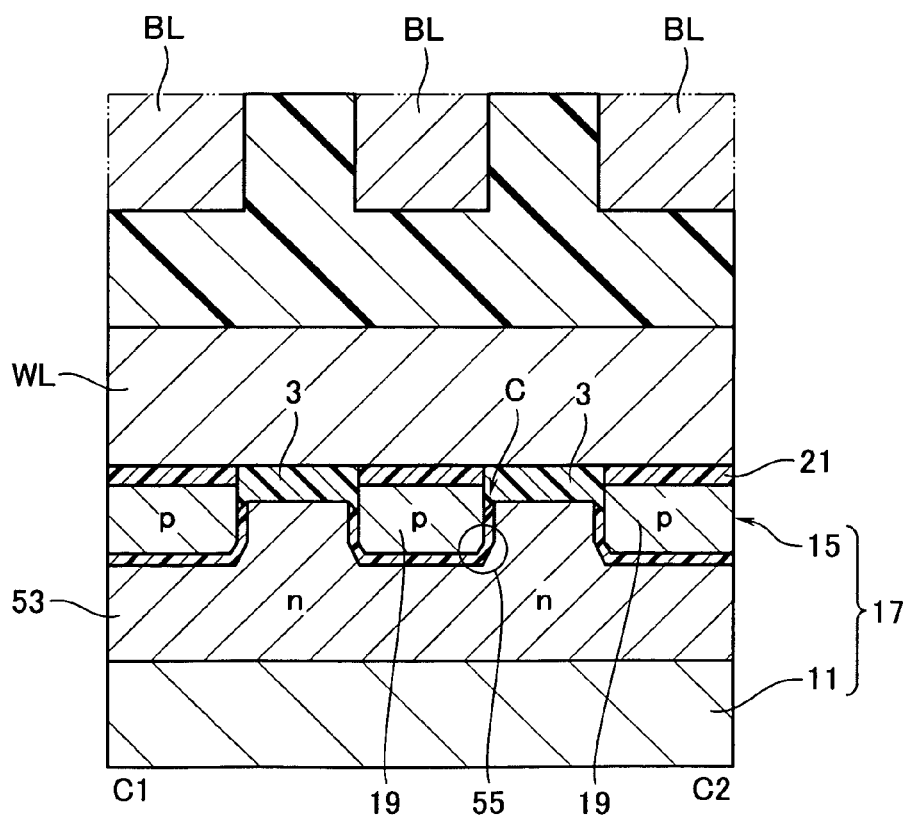
FIG. 14 is a sectional view of a second comparative example.
Figure 15A:
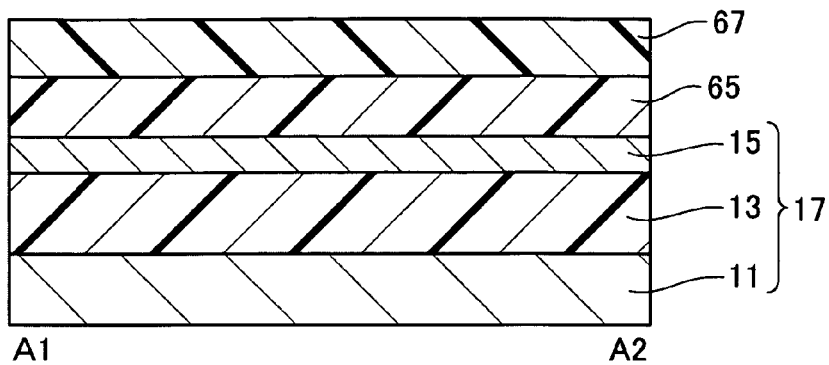
FIG. 15A is a first process step diagram (cross-section taken along line A1–A2) of a fabrication method of the semiconductor device in accordance with the first embodiment.
Figure 15B:
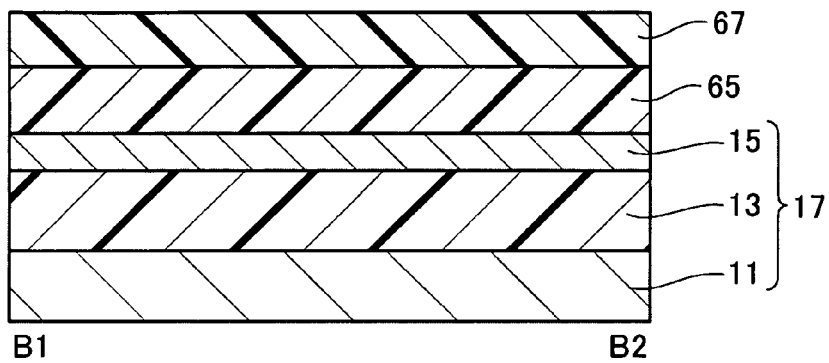
FIG. 15B is a first process step diagram (B1–B2 cross-section) of the same.
Figure 15C:
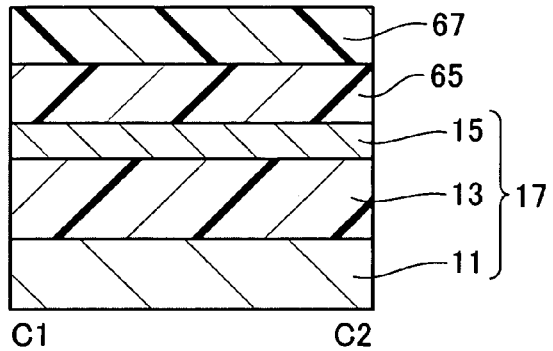
FIG. 15C is a first process step diagram (C1–C2 cross-section) of the same.
Figure 15D:
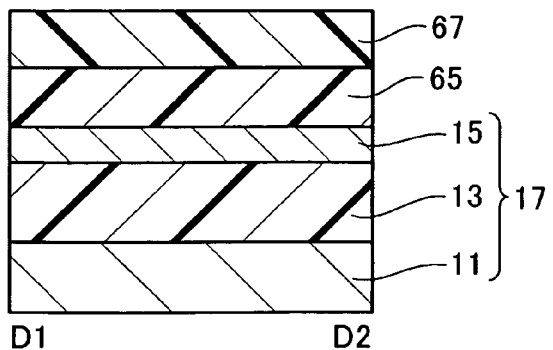
FIG. 15D is a first process step diagram (D1–D2 cross-section) of the same.
Figure 16A:
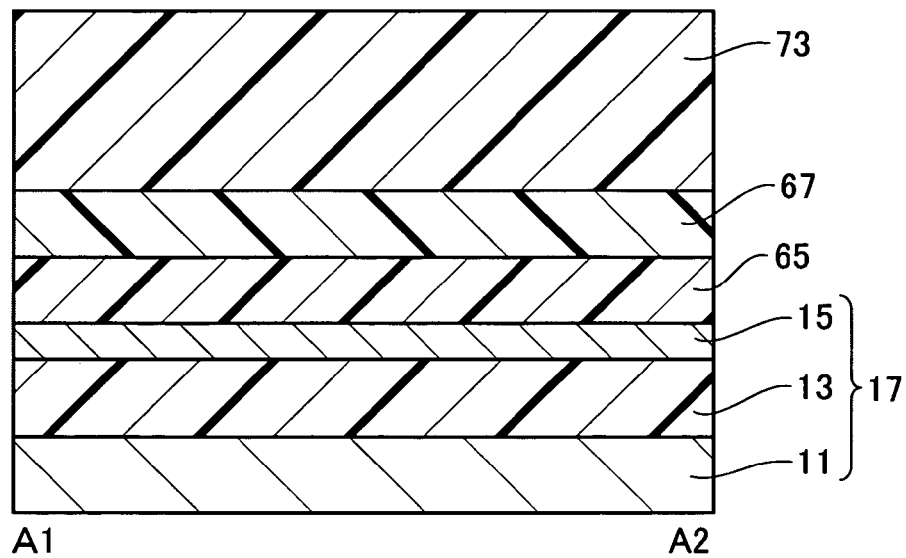
FIG. 16A is a second step diagram (A1–A2 cross-section) of the same.
Figure 16B:
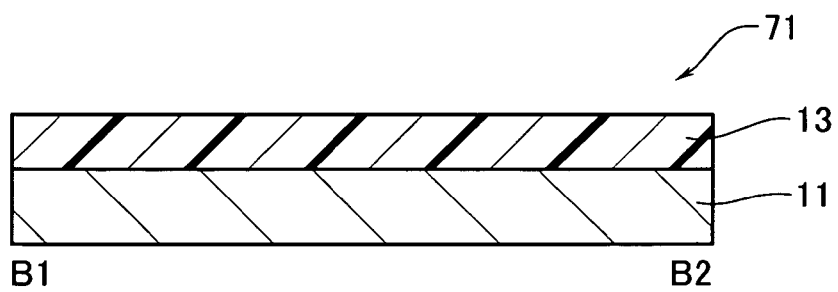
FIG. 16B is a second step diagram (B1–B2 cross-section) of the same.
Figure 16C:
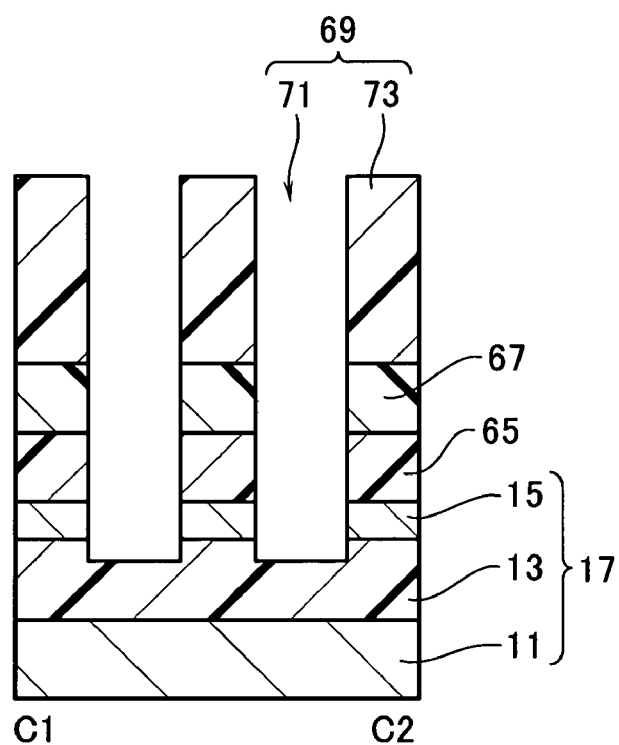
FIG. 16C is a second step diagram (C1–C2 cross-section) of the same.
Figure 16D:
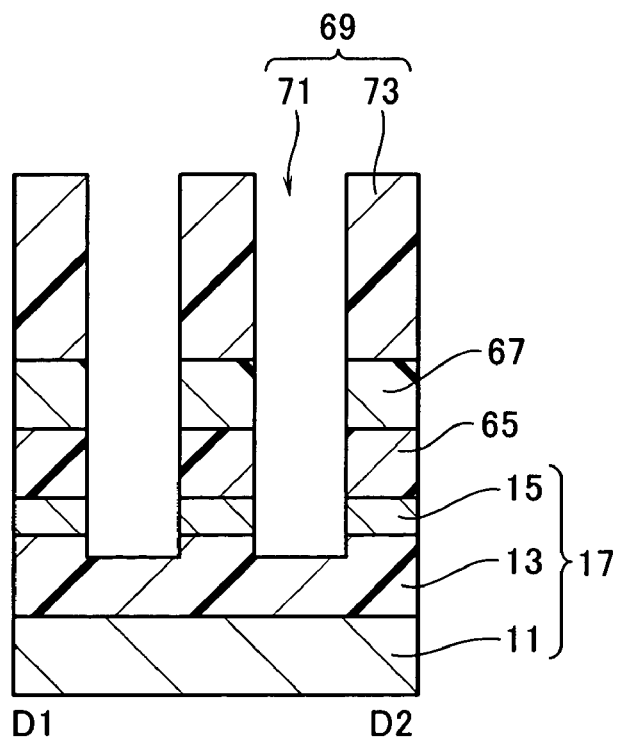
FIG. 16D is a second step diagram (D1–D2 cross-section) of the same.
Figure 17A:
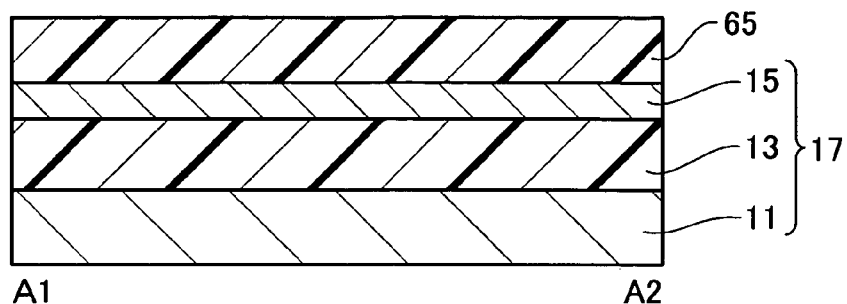
FIG. 17A is a third step diagram (A1–A2 cross-section) of the same.
Figure 17B:
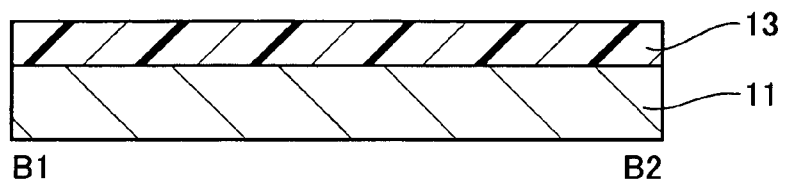
FIG. 17B is a third step diagram (B1–B2 cross-section) of the same.
Figure 17C:
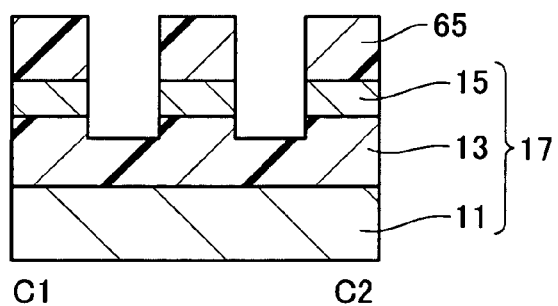
FIG. 17C is a third step diagram (C1–C2 cross-section) of the same.
Figure 17D:
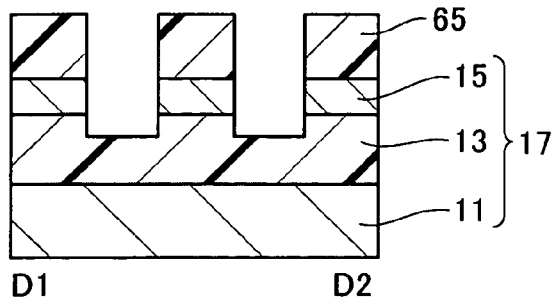
FIG. 17D is a third step diagram (D1–D2 cross-section) of the same.
Figure 18A:
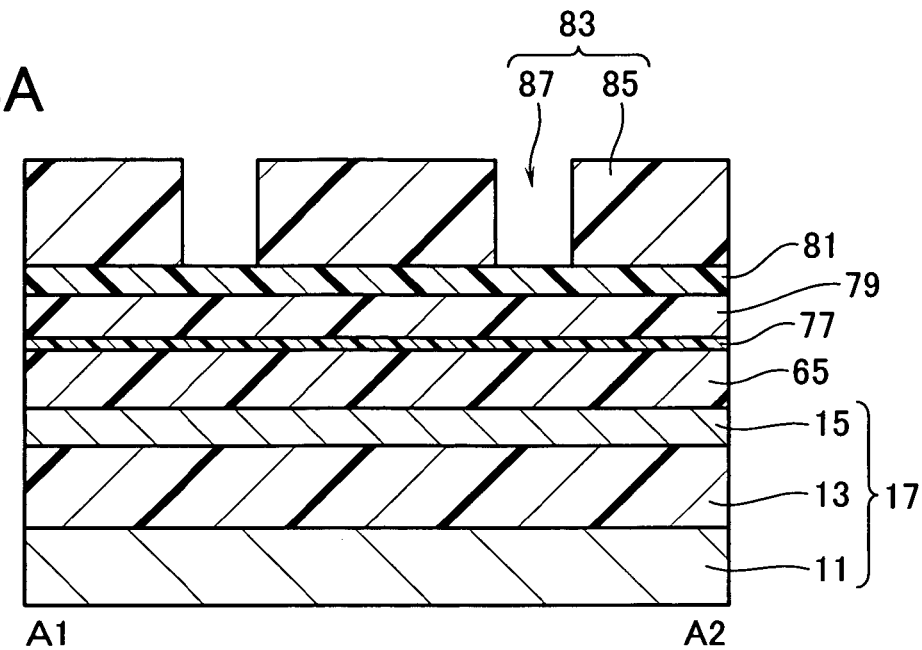
FIG. 18A is a fourth step diagram (A1–A2 cross-section) of the same.
Figure 18B:
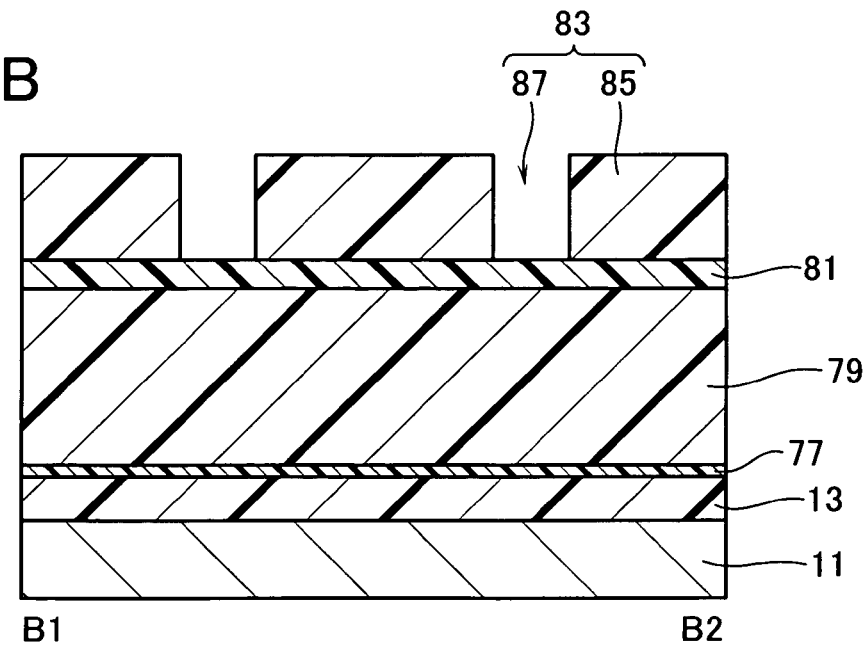
FIG. 18B is a fourth step diagram (B1–B2 cross-section) of the same.
Figure 18C:
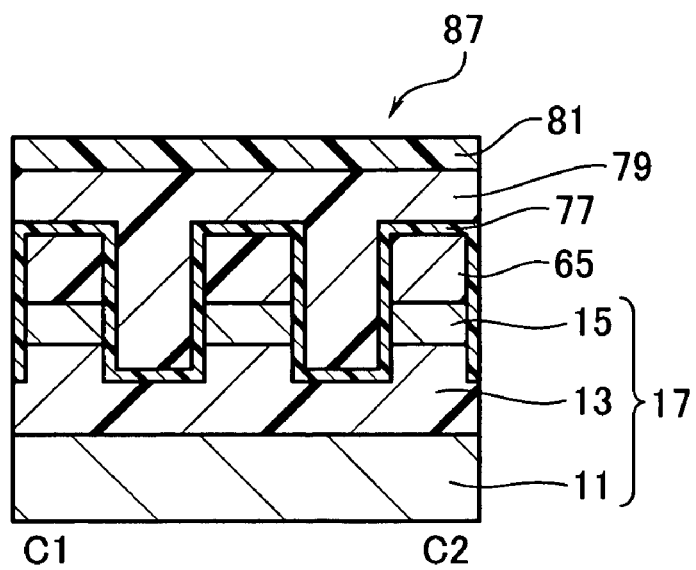
FIG. 18C is a fourth step diagram (C1–C2 cross-section) of the same.
Figure 18D:
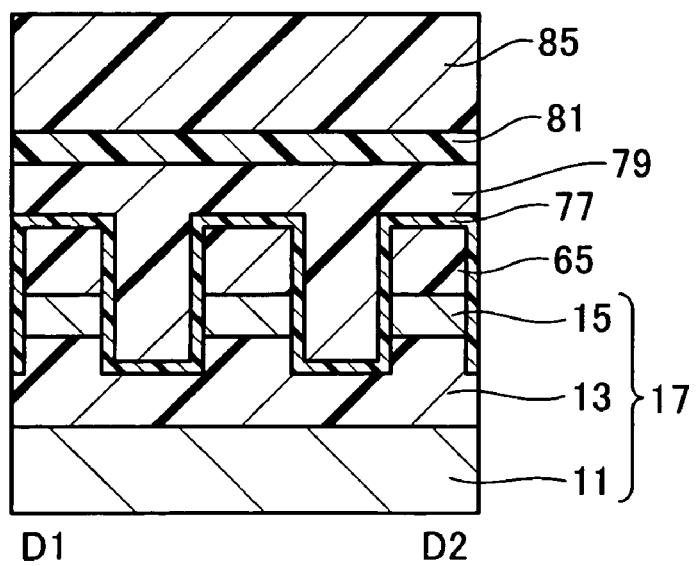
FIG. 18D is a fourth step diagram (D1–D2 cross-section) of the same.
Figure 19A:
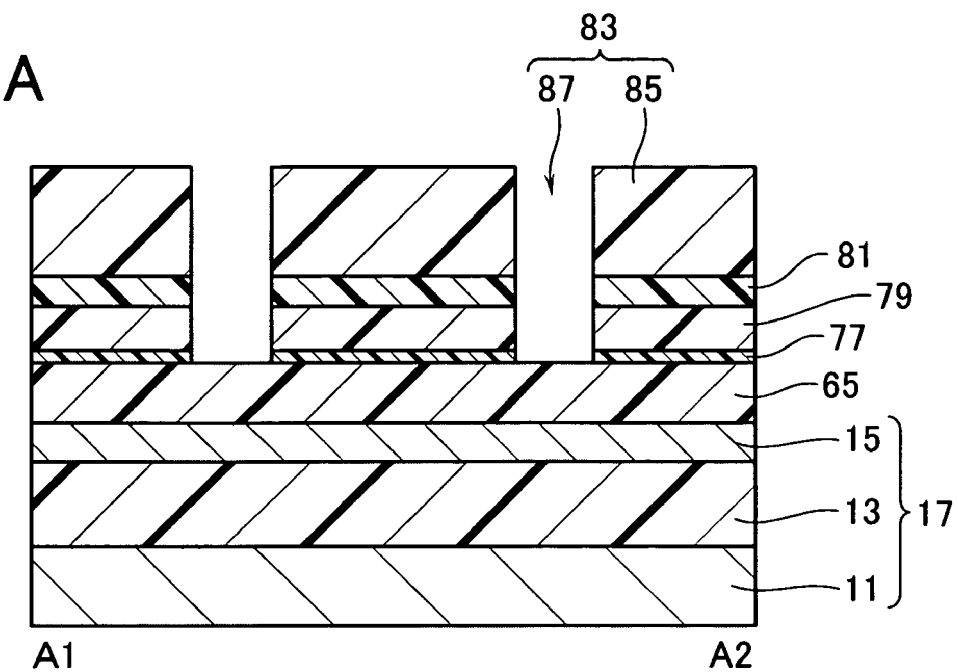
FIG. 19A is a fifth step diagram (A1–A2 cross-section) of the same.
Figure 19B:
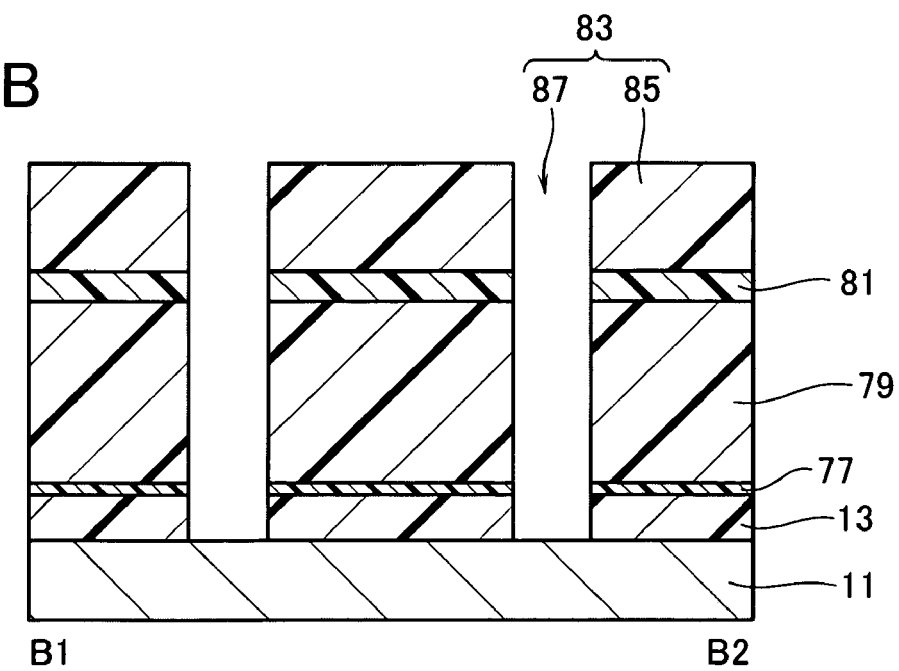
FIG. 19B is a fifth step diagram (B1–B2 cross-section) of the same.
Figure 19C:
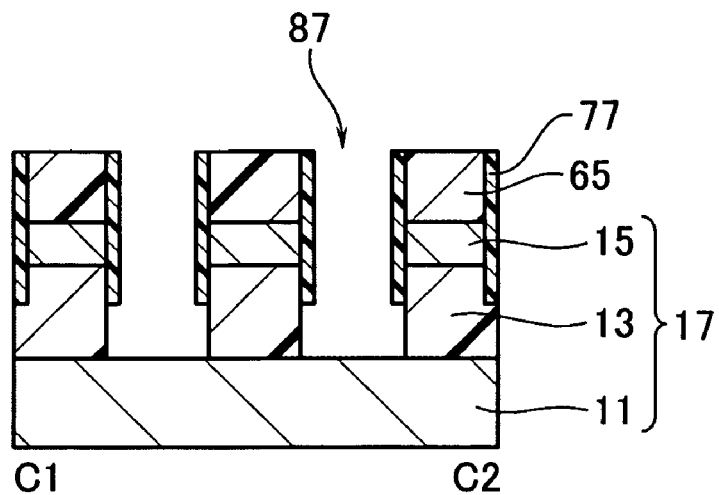
FIG. 19C is a fifth step diagram (C1–C2 cross-section) of the same.
Figure 19D:
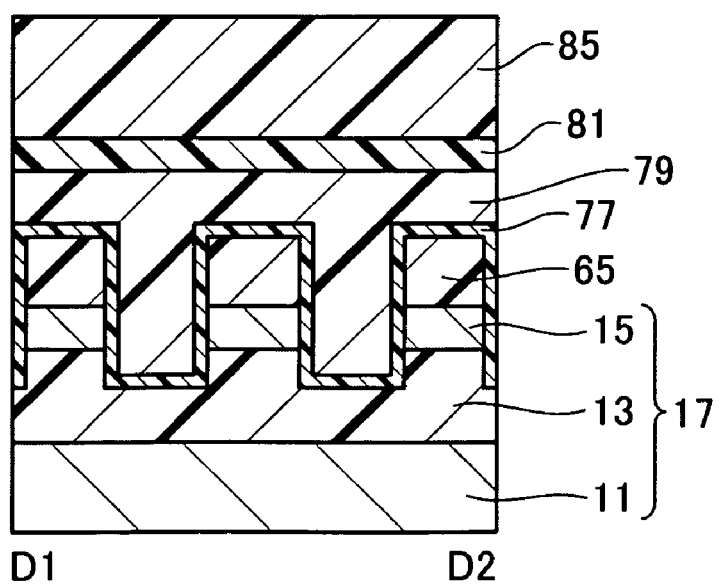
FIG. 19D is a fifth step diagram (D1–D2 cross-section) of the same.
Figure 20A:
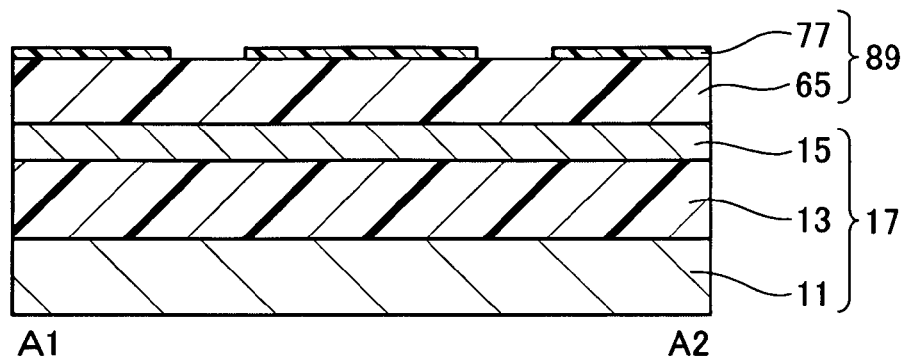
FIG. 20A is a sixth step diagram (A1–A2 cross-section) of the same.
Figure 20B:
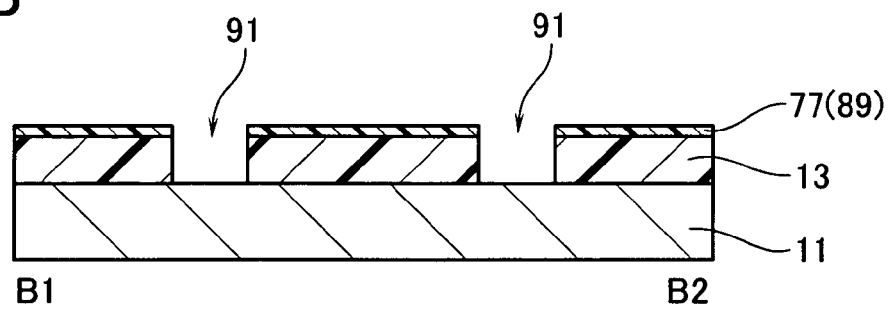
FIG. 20B is a sixth step diagram (B1–B2 cross-section) of the same.
Figure 20C:
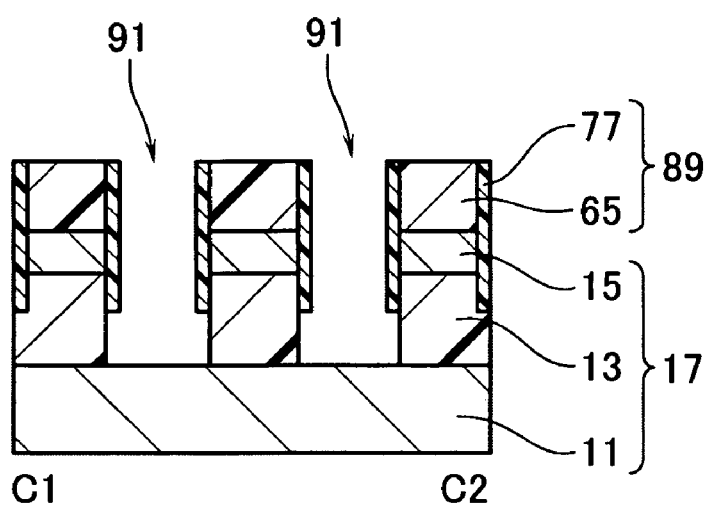
FIG. 20C is a sixth step diagram (C1–C2 cross-section) of the same.
Figure 20D:
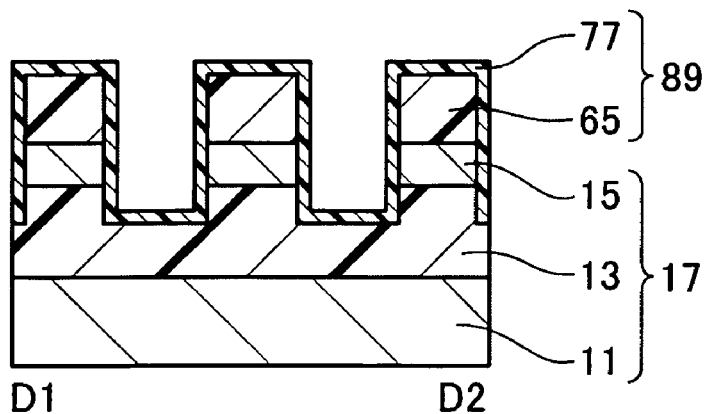
FIG. 20D is a sixth step diagram (D1–D2 cross-section) of the same.
Figure 21A:
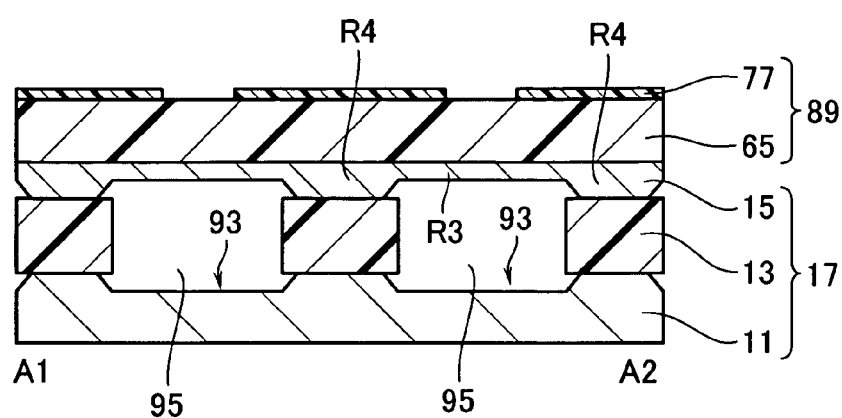
FIG. 21A is a seventh step diagram (A1–A2 cross-section) of the same.
Figure 21B:
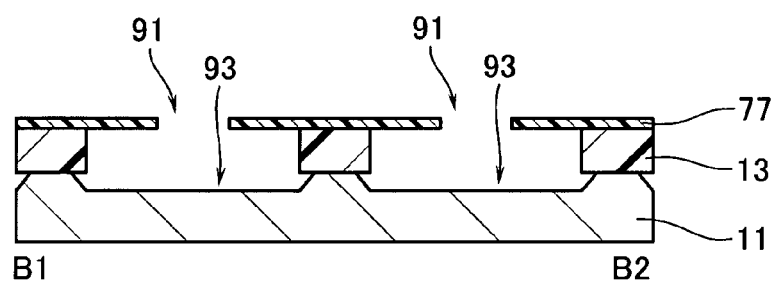
FIG. 21B is a seventh step diagram (B1–B2 cross-section) of the same.
Figure 21C:
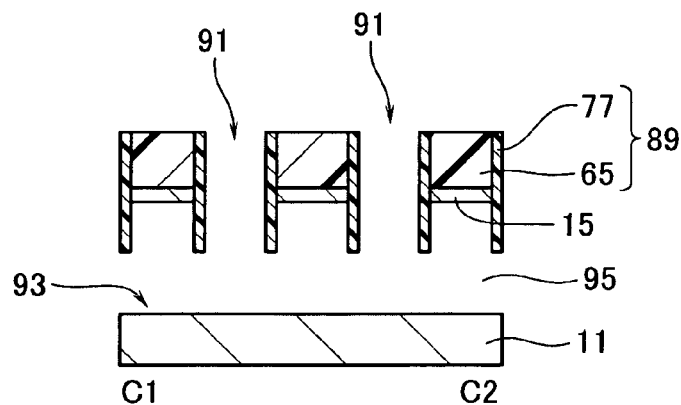
FIG. 21C is a seventh step diagram (C1–C2 cross-section) of the same.
Figure 21D:
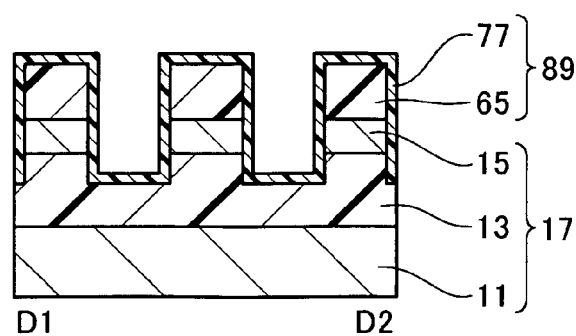
FIG. 21D is a seventh step diagram (D1–D2 cross-section) of the same.
Figure 22A:
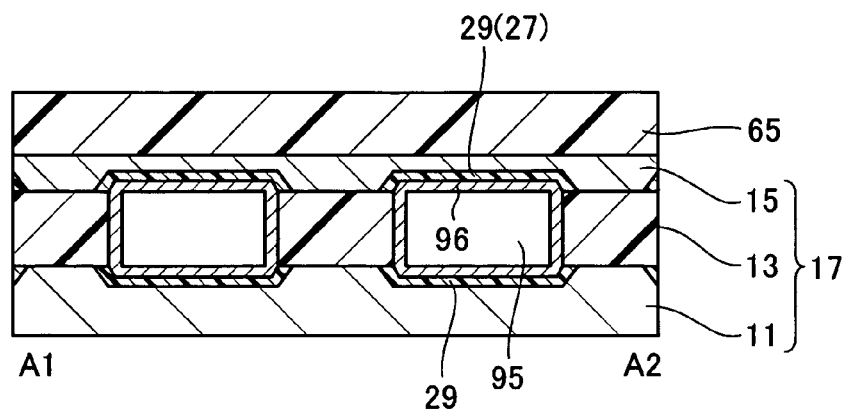
FIG. 22A is an eighth step diagram (A1–A2 cross-section) of the same.
Figure 22B:
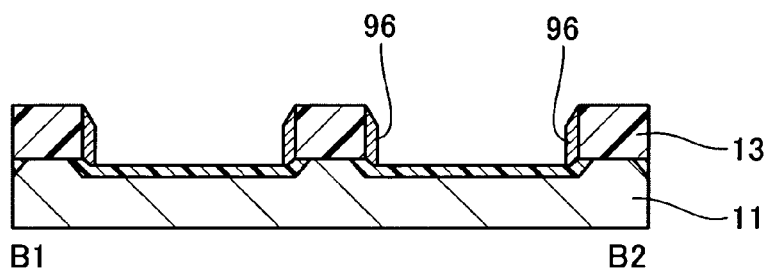
FIG. 22B is an eighth step diagram (B1–B2 cross-section) of the same.
Figure 22C:
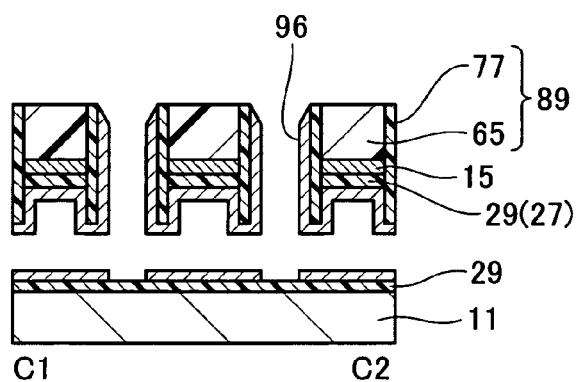
FIG. 22C is an eighth step diagram (C1–C2 cross-section) of the same.
Figure 22D:
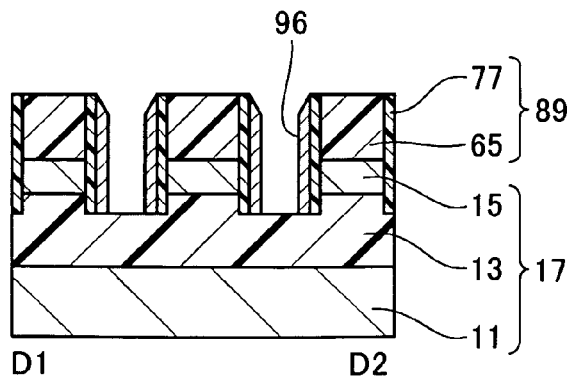
FIG. 22D is an eighth step diagram (D1–D2 cross-section) of the same.
Figure 23A:
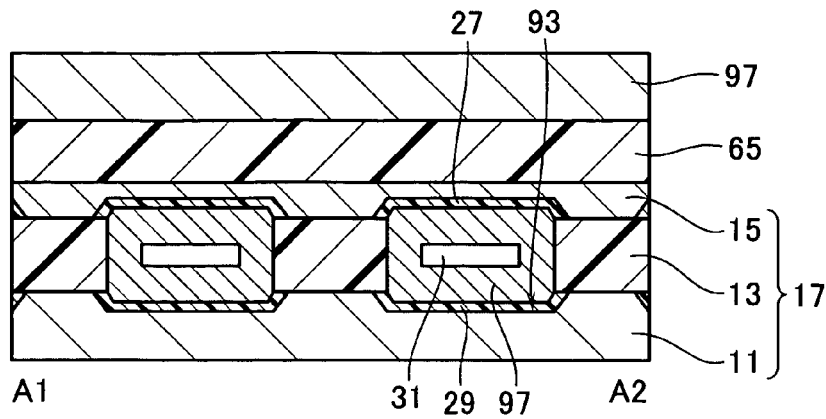
FIG. 23A is a ninth step diagram (A1–A2 cross-section) of the same.
Figure 23B:
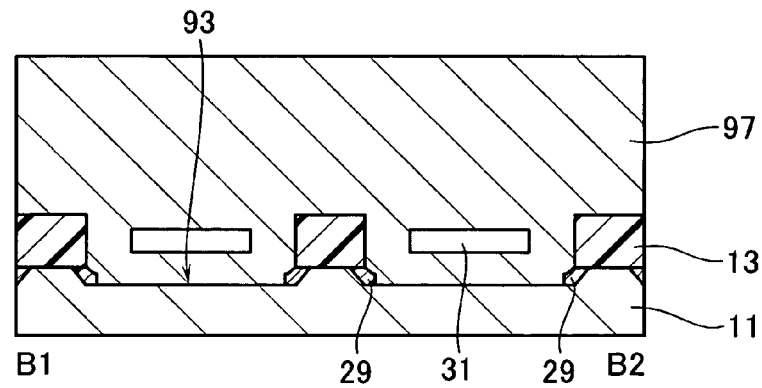
FIG. 23B is a ninth step diagram (B1–B2 cross-section) of the same.
Figure 23C:
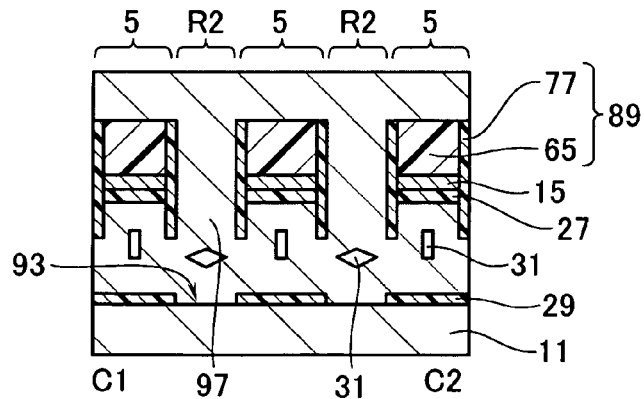
FIG. 23C is a ninth step diagram (C1–C2 cross-section) of the same.
Figure 23D:
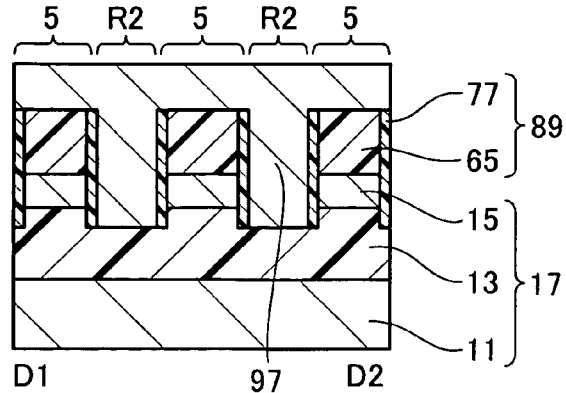
FIG. 23D is a ninth step diagram (D1–D2 cross-section) of the same.

Main effects and advantages of the first embodiment will be explained while comparing it to first and second examples for comparison use. FIG. 10 is a plan view of part of a cell array in accordance with the first comparative example. FIG. 11 is a cross-sectional diagram as taken along line A1–A2 of FIG. 10. FIG. 12 is a sectional diagram taken along line B1–B2 of FIG. 10. FIG. 13 is a sectional view along line C1–C2 of FIG. 10. FIG. 14 is a sectional diagram of the second comparative example, which corresponds to FIG. 13 of the first comparative example.

In the first and second comparative examples, not the back gate electrodes but side face electrodes 53 are provided. As shown in FIG. 13, the side face electrodes 53 of the first comparative example are provided under isolation portions 3 in such a manner that each opposes a side surface of channel body 19. As shown in FIG. 14, a side face electrode 53 of the second comparative example is provided to oppose both a side face and a bottom of channel body 19.

The side face electrode 53 has a similar function to that of the back gate electrode 25. In short, as shown in FIGS. 13 and 14, the side face electrode 53 and dielectric film plus channel body 19 make up a capacitor C. Owing to this capacitor C, holes storable on channel body 19 increase in number. The second comparative example is capable of further increasing the number of holes to be stored at channel body 19 than the first comparative example due to the fact that side face electrode 53 opposes even at the bottom face of body 19.

Effect 1:

The first embodiment is capable of lessening a leakage current when compared to the first and second comparative examples. The reason of this will be explained below. As shown in FIG. 13, in the first comparative example, the buried oxide film 13 is subjected to wet etching, and side face electrode 53 is buried in the resultant structure. Because of the wet etching, buried oxide film 13 is patterned or "cropped" in a lateral direction also. Accordingly, side face electrode 53 extends up to a position at which it opposes an edge portion of the bottom face of channel body 19. Hence, the capacitor C has a corner 55. On the other hand, in the second comparative example of FIG. 14, the capacitor C has a corner 55 due to the fact that side face electrode 53 opposes the side surface and bottom face of channel body 19.

As convergence or focusing of an electric field tends to occur at the corner 55, a leakage path can readily be created at corner 55 between the channel body 19 and side face electrode 53. This pauses a problem as to a decrease in data retention time. Furthermore, the electric field focusing would result in a parasitic transistor with a low threshold voltage being formed at the corner, which leads to an unwanted increase in magnitude of a leakage current flowing between source and drain.

In contrast, the first embodiment is arranged so that a bottom portion 3a of isolator 3 is placed at a lower level than the channel body 19 (silicon layer) as shown in FIG. 2C. In other words, the height of a back gate line BGL in the region where this line BGL and channel body 19 do not overlap each other is made lower than the height in the region where these overlap each other. Due to this, the above-noted corner is no longer created in the capacitor C (FIG. 2C); thus, it is possible to lessen a leakage current flowing between channel body 19 and side face electrode 53. In addition, no parasitic transistors are formed so that it is possible to lessen any source-drain leakage current.

Effect 2:

As shown in FIGS. 10 and 14, the device formation region 5 is made up of the channel body 19, drain region 7 and source region 9. In the second comparative example the side face electrode 53 extends to reach a portion underlying the device formation region 5. Due to this, the buried oxide layer 13 is absent under device formation region 5.

The buried oxide layer 13 functions to support the device formation region 5 (silicon layer). In the second comparative example, it should be required that a silicon layer be provided for common connection of source regions of FIG. 10 in the x direction while supporting the device formation region 5 by a buried oxide layer that is left under the silicon layer. If the silicon layer for common connection of the source regions is too small in width w1, then its underlying oxide film 13 is laterally etched away and then lost completely; thus, device formation region 5 drops down or "caves in" due to its own weight. An approach to avoiding this cave-in accident is to design the buried oxide film to measure 1F in width. To do this, it is required to enlarge the width w1 up to 2.5F while taking account of the fact that buried oxide layer 13 is laterally etched by a degree equivalent to 1.5F, which is a total value of etching amounts on the both sides. This would result in an increase in size (cell size) of memory transistor. Note here that "F" refers to a minimal feature size determined by a lithography technique used.

In contrast, the first embodiment is arranged to comprise the buried oxide layer 13 that is provided on the silicon substrate 11 for supporting the silicon layer 15 at part underlying the drain region 7 and source region 9 as shown in FIGS. 1 and 2A–2B. The use of this buried oxide layer 13 achieves the required mechanical strength of the device formation region 5 (silicon layer).

Unlike the second comparative example, the first embodiment is such that the silicon layer 15 is supported by the buried oxide layer 13 also at the location beneath the drain region 7. Due to this, it is possible to make the width of buried oxide layer 13 beneath source region 9 smaller than that in the second comparative example. Thus, according to the first embodiment, it is possible to lessen the size of memory transistor MT.

One example of this size is as follows. As shown in FIGS. 1 and 2A, the gate length L1 of back gate electrode 25 (that is, the width of back gate electrode 25) is set at 2.5F. Hence, the size S of memory transistor (cell size) is given as $7.0F^2$ (=3.5F×2.0F). It is required that the gate length L1 of back gate electrode 25 be larger than a gate length L2 (=1F) of front gate electrode 23 (word line WL). Otherwise, in cases where misalignment occurs between a pattern of word lines WL and a pattern of back gate lines BGL, part of a channel body 19 whose position is defined by a word line(s) WL is undesirably located outside of the back gate electrode 25, resulting in a decrease in capacitance between the channel body and back gate electrode. Also note that the width of buried oxide layer 13 is carefully designed to have 1F to ensure that the device formation region 5 (silicon layer) with its width 2.5 times greater than that of layer 13 does no longer cave in due to its own weight. According to experimentation, it has been verified that no cave-in accidents occur even when the device formation region 5 has a width five times greater than that of buried oxide layer 13. However, it is preferable to set the width at about a threefold value for the reason which follows: if the gate length L1 of back gate line BGL is simply enlarged too much, then the cell size increases and the parasitic capacitance also increases as will be described later. In this way, according to the first embodiment, it is possible to achieve down-sizing or miniaturization of the memory transistors, by specifically setting the gate length L1 of back gate line BGL so that it is greater than a onefold value of the gate length L2 of front gate electrode 23 (word line WL) and yet less than or equal to thrice the gate length L2 thereof.

Effect 3:

In the second comparative example of FIG. 14, in a similar way to the channel body 19, the side face electrode 53 is disposed to oppose its side surface and bottom face even in the drain region. Accordingly, an area in which the drain region and the side face electrode 53 overlap each other becomes larger; with this area increase, a parasitic capacitance made up of the drain region and side face electrode 53 also becomes larger. If this parasitic capacitance increases then the high speed switching of bit line BL voltage becomes more difficult.

In contrast, the first embodiment is such that a relatively thick buried oxide layer 13 is laid out at a location beneath the drain region 7 as shown in FIG. 2A. Thus it is possible to lessen the area in which the drain region 7 overlaps the back gate electrode 25 through a thin second gate insulation film 27. In case the gate length L1 of back gate line BGL is set at a value three times greater than the gate length L2 of front gate electrode 23 (word line WL), the ratio of parasitic capacitance out of the total capacitance of back gate line BGL is as small as two third. Thus it is possible to make smaller the parasitic capacitance made up of drain region 7 and back gate electrode 25, which in turn makes it possible to achieve the speed-up of the switching of bit line BL voltage.

(Semiconductor Device Fabrication Method)

An explanation will be given about a fabrication method of the semiconductor device in accordance with the first embodiment with reference to FIGS. 15A through 26D. These drawings are cross-sectional diagrams of an SOI substrate or the like, for indicating this fabrication method in the order of process steps. In these drawings, a cross-section taken along line A1–A2 corresponds to FIG. 2A; a cross-section along line B1–B2 corresponds to FIG. 2B; a cross-section along line C1–C2 corresponds to FIG. 2C; and, a D1–D2 cross-section corresponds to FIG. 2D, respectively.

As shown in FIGS. 15A, 15B, 15C and 15D, an SOI substrate 17 is prepared. The SOI substrate 17 has a multi-layer structure with a lamination of a silicon substrate 11 for use as a support substrate, a buried oxide layer 13 (with a thickness of 150 nm for example), and a p-type single-crystalline silicon layer 15 (with a thickness of 60 nm for example).

Next, in such a way as to cover the silicon layer 15, sequentially formed are a silicon oxide film (not shown) with a thickness of 2 nm by thermal oxidation, a silicon nitride film 65 with a thickness of 180 nm (one example of the lower layer portion of etching stopper) by chemical vapor deposition (CVD), and a silicon oxide film 67 with a thickness of 180 nm by CVD.

Figure 27:
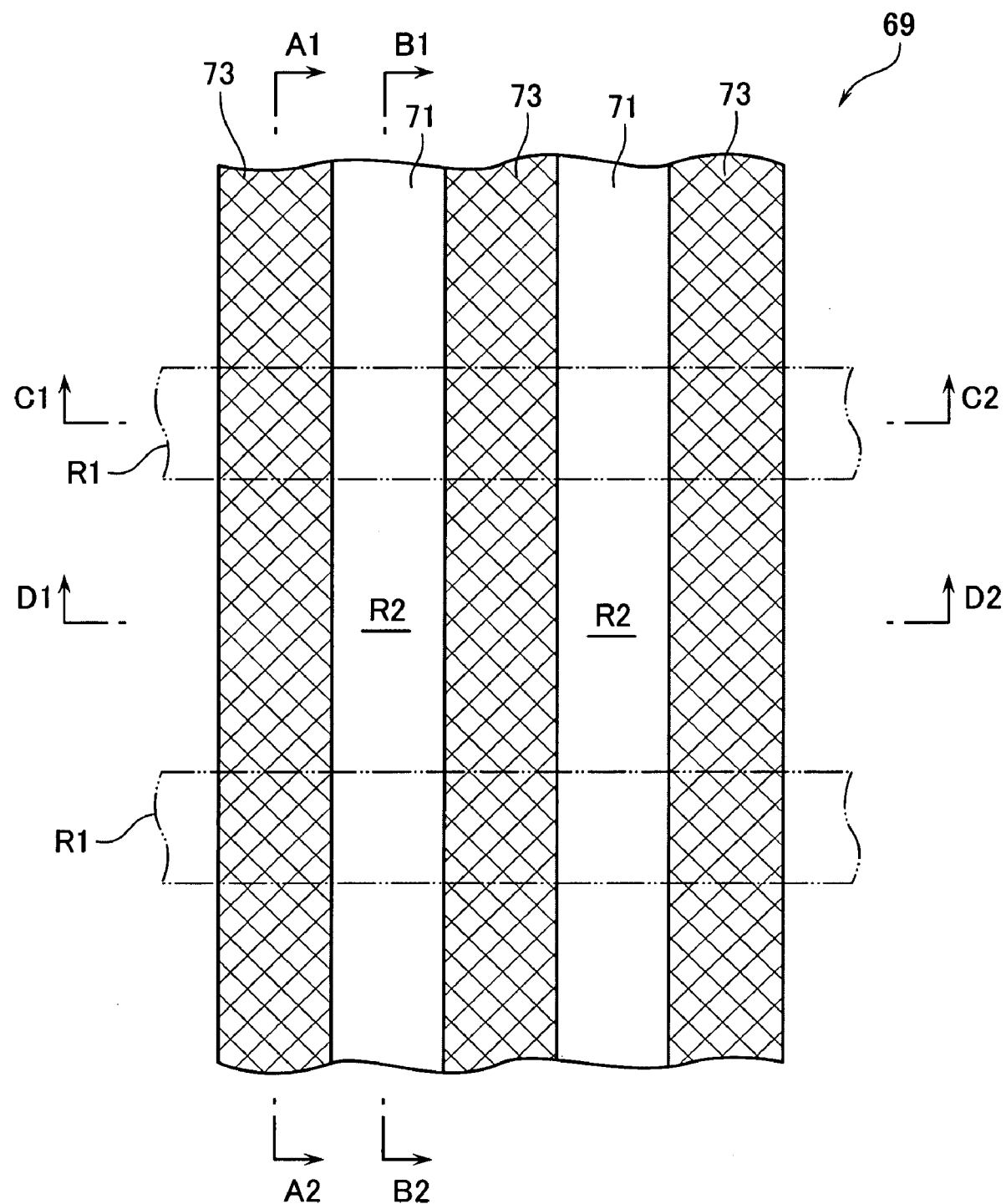
FIG. 27 is a plan view of a resist pattern used at the second step.

As shown in FIGS. 16A, 16B, 16C and 16D, a resist pattern 69 is formed on the silicon oxide film 67 by photolithography techniques. FIG. 27 is a plan view of the resist pattern 69. This resist pattern 69 has an opening 71 that corresponds to a pattern of an isolating portion formation region R2 in which an isolating portion 3 (FIG. 1) is to be formed, and also has a resist portion 73 corresponding to a pattern of device formation region 5 (FIG. 1). Note that "R1" indicates a wordline formation region (one example of first gate line formation region) in which a word line WL is to be formed.

With the resist pattern 69 as a mask, reactive ion etching (RIE) is performed to selectively remove the silicon oxide film 67, silicon nitride film 65 and silicon layer 15. In short, the films or layers in the isolating portion formation region R2 are selectively removed away. And, as shown in FIGS. 17A, 17B, 17C and 17D, the resist pattern 69 and the silicon oxide film 67 are removed.

Next, as shown in FIGS. 18A, 18B, 18C and 18D, a thermal oxide film (not shown) with a thickness of 2 nm is formed on a side surface of the silicon layer 15. Thereafter, a silicon nitride film 77 (one example of the upper layer portion of etching stopper) with a thickness of 10 nm is formed by CVD in such a manner as to cover the silicon nitride film 65 and buried oxide layer 13. After forming the nitride film 77 a resist 79 is formed for making step-like surface differences be planarized, and then a spin-on-glass (SOG) film 81 is formed thereon.

Figure 28:
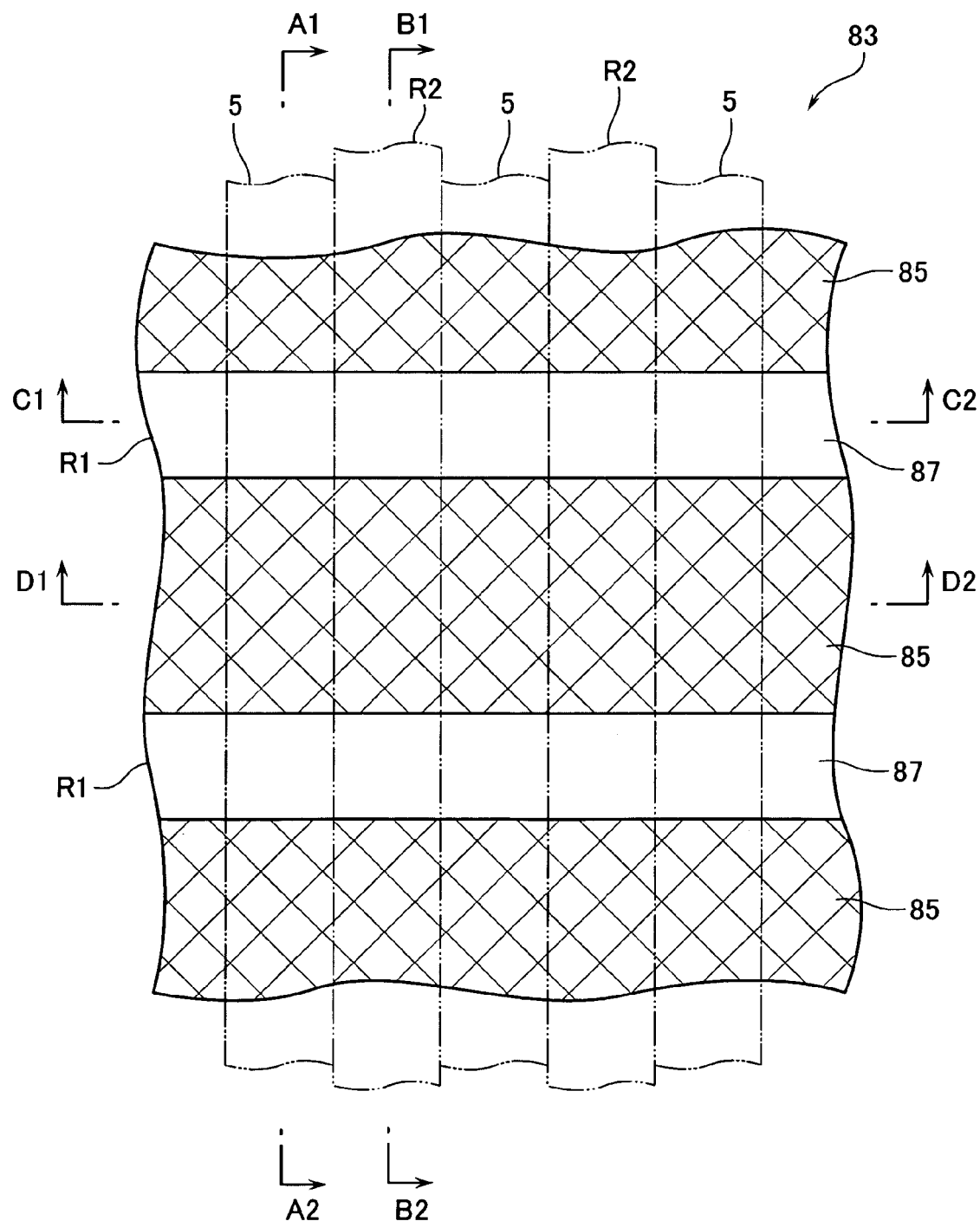
FIG. 28 is a plan view of a resist pattern used at the fourth step.

Then, photolithography is performed to form a resist pattern 83 on the SOG film 81. A plan view of the resist pattern 83 is shown in FIG. 28. This pattern 83 has a resist portion 85 and an opening 87 corresponding to a wordline formation region R1.

As shown in FIGS. 19A, 19B, 19C and 19D, reactive ion etching is performed with the resist pattern 83 as a mask, to thereby selectively remove the SOG film 81, resist 79, silicon nitride film 77 (one example of the upper layer part of etching stopper) and buried oxide layer 13.

Then, as shown in FIGS. 20A, 20B, 20C and 20D, the resist pattern 83, SOG film 81 and resist 79 are removed. Silicon nitride films 65 and 77 make up an etching stopper 89.

Figure 29:
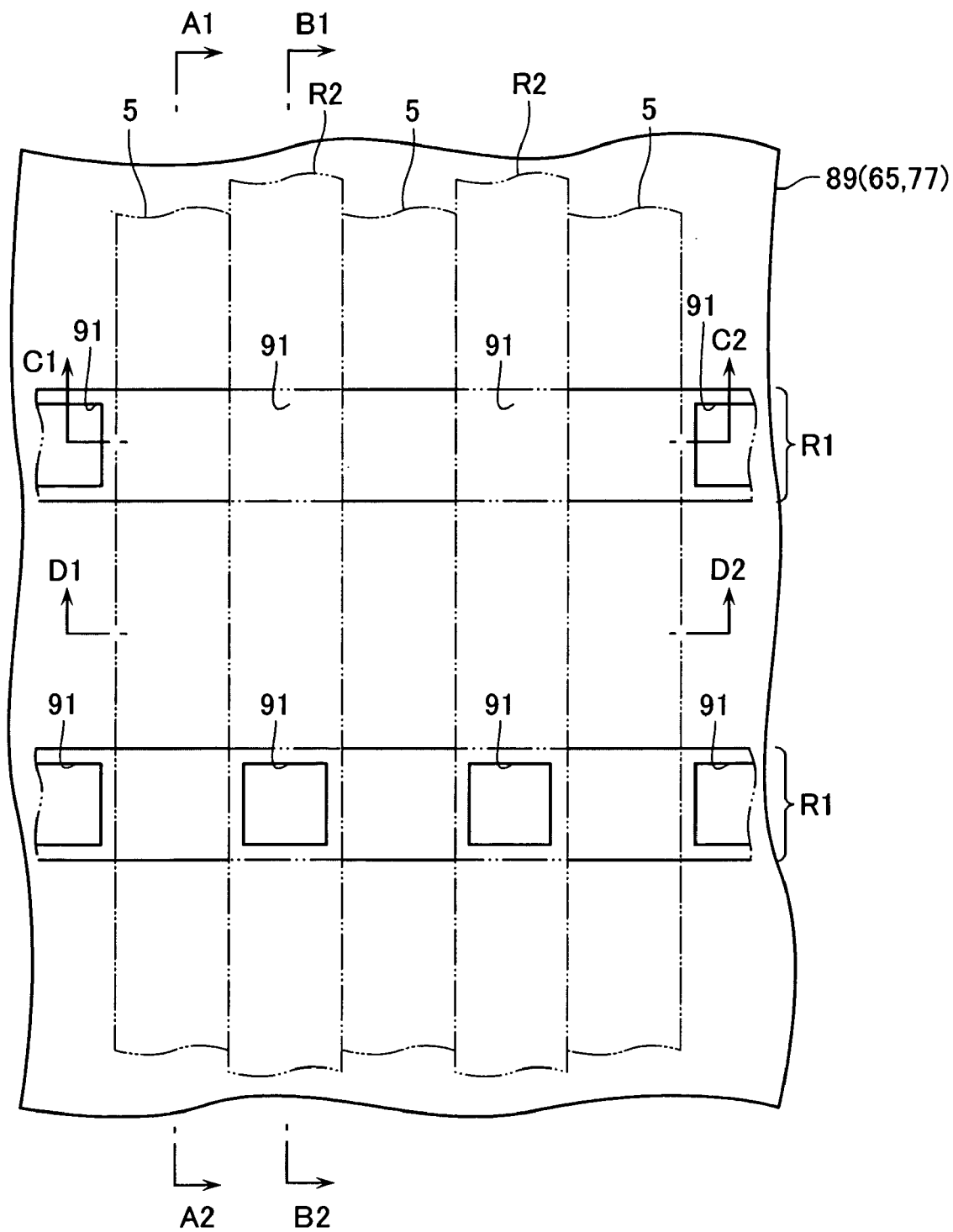
FIG. 29 is a plan view of an etching stopper as formed at the sixth step.

FIG. 29 is a plan view of the etch stopper 89. Certain portions from which the silicon nitride films 65, 77 have been removed away become openings 91 of etch stopper 89. More specifically, each opening 91 is positioned at a portion at which the wordline formation region R1 and isolator portion formation region R2 cross together.

Figure 30:
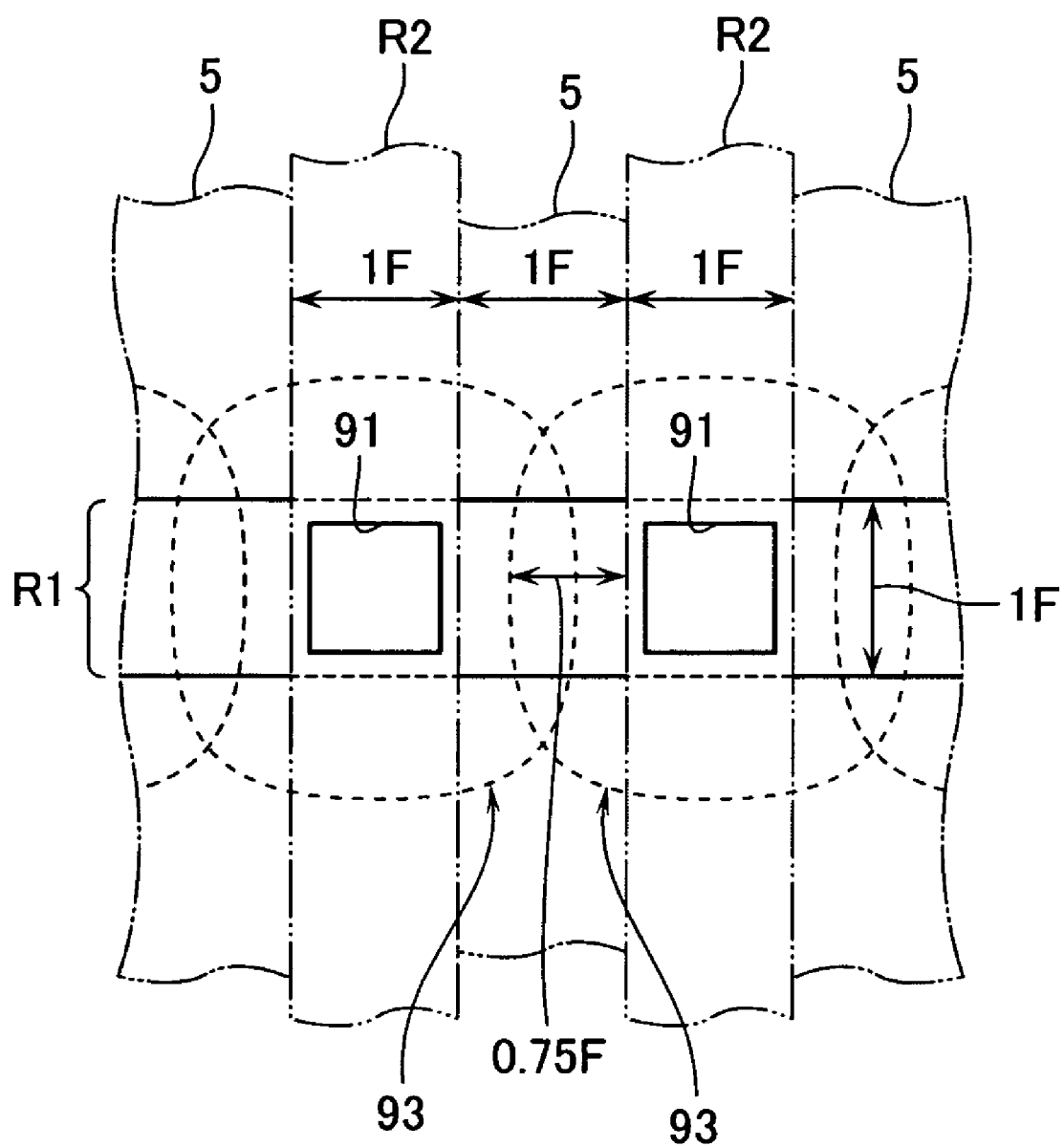
FIG. 30 is a plan view of part near an opening of the etch stopper at the seventh step.

As shown in FIGS. 21A through 21D, with the etch stopper 89 being formed, an ammonium fluoride is used to apply wet etching to the buried oxide layer 13. This etching of the buried oxide layer 13 progresses from nearby portions of the openings 91 in isotropic fashion. FIG. 30 is a plan view of two neighboring openings 91. By etching the buried oxide layer 13 by a degree of about 0.75F from openings 91, the neighboring etching regions 93 are coupled together.

Although it is possible to couple an etching region to its neighboring etching region 93 by etching amount of 0.5F, the etching amount here is set at about 0.75F in order to ensure the coupling.

Figure 31:
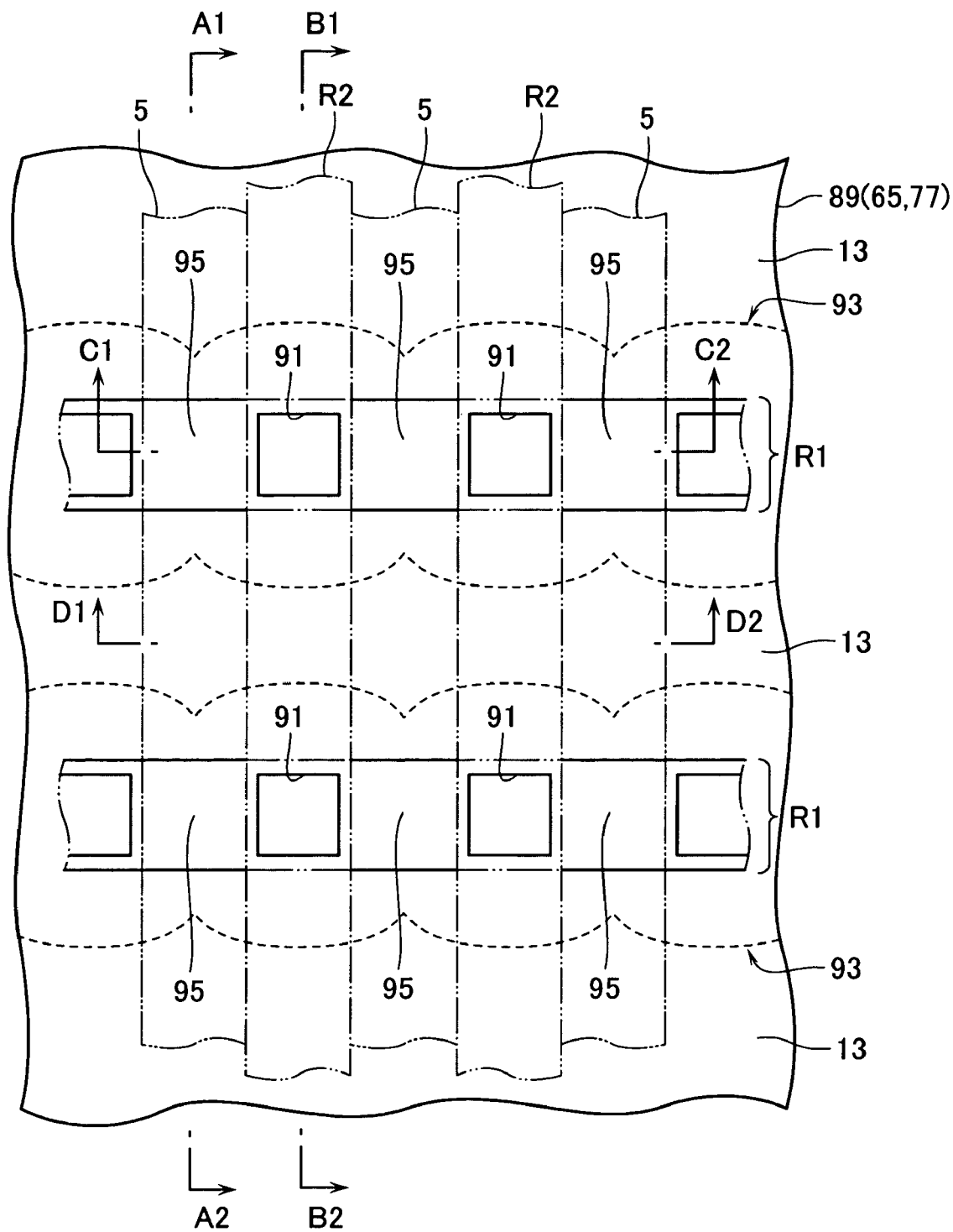
FIG. 31 is a plan view of an etching region formed at the seventh step.

Due to this etching, an etching region or "a buried-oxide-etched region" 93 having a cavity or void 95 is formed to underlie the silicon layer 15 in which a channel body is to be formed. FIG. 31 is a plan view of a structure with etching regions 93. The etching regions 93 are formed along the direction of wordline formation regions R1. Selected portions of the buried oxide layer 13 are left along a direction in which wordline formation regions R1 extend while passing under the silicon layer 15 in which source and drain regions are to be formed. Owing to these portions of buried oxide layer 13 each of which is left to have a stripe-like shape, the silicon layer 15 is prevented from accidentally falling down or "caving in" due to its own weight.

After the completion of the etching using ammonium fluoride, chemical dry etching (CDE) is performed to thereby etch those portions of the silicon layer 15 which are exposed at the voids 95, thus thinning silicon layer 15 to measure about 30 nm in thickness. In these exposed portions of silicon layer 15, channel bodies are formed. Accordingly, the thickness of silicon layer 15 of a channel body formation region R3 (FIG. 21A) becomes less than that of an impurity region formation region R4 (FIG. 21A) in which source and drain regions are to be formed. The process step of thinning the silicon layer 15 can be omitted and may be performed when the need arises.

Thinning the channel body results in generation of the following effects (1) and (2). (1) It is possible to lessen the junction capacitance between a channel body and a drain region (source region); thus, it is possible to enlarge a signal difference between data "0" and data "1." This makes it possible to prevent any erroneous data readout, known as read errors. (2) As a leakage current flowable between the channel body and drain region (source region) decreases in magnitude, it is possible to lengthen the data retention time. As apparent from the foregoing, thinning the channel body makes it possible to improve the performance of the semiconductor device (DRAM) in accordance with the first embodiment.

On the other hand, the impurity region formation region R4 is relatively thick so that it is possible to reduce parasitic resistance components of source and drain regions. Explaining in detail the reason thereof, it is possible to set n-type impurities of source and drain regions at an increased level of concentration density. If an n-type impurity is simply doped by ion implantation into a thin region with a decreased film thickness at a high level of dose amount, then an entirety of the semiconductor layer is unintentionally amorphized and exhibits high resistivity because it is hardly recrystallized during thermal processing to be later applied thereto. If the film thickness is large in value then a single-crystalline layer must remain at the lower portion of semiconductor layer even after having doped by ion implantation an n-type impurity thereinto at an increased dose amount; thus, the region of interest is recrystallized due to thermal processing to be later executed. Further, if the concentration density of n-type impurity is less, when a silicide is formed, the interface resistance between the silicide and semiconductor layer increases undesirably.

Additionally, in case the logic circuit shown in FIG. 3 is mounted in a mixed or hybrid manner, the thickness of silicon layer 15 may be arranged so that the formation region of such logic circuit is greater in thickness than the memory transistor formation region. With such an arrangement, it is possible to reduce parasitic resistances of source/drain regions in the logic circuit while at the same time permitting memory transistors to obtain the effects owing to the thinning of channel body stated supra.

The next process step will be explained. As shown in FIGS. 22A to 22D, the silicon nitride film 77 is etched by anisotropic etch techniques. Then, thermal oxidation is performed to form silicon oxide films 29 on exposed surface portions of the silicon substrate 11 and silicon layer 15. A silicon oxide film 29 that is in contact with the exposed portion of silicon layer 15 at a void 95 becomes the second gate insulation film 27. The second gate insulation film 27 has a thickness of about 10 nm. Next, an amorphous silicon film 96 with a thickness of about 50 nm is formed by CVD; then, anisotropic etching is applied to this film 96.

As shown in FIGS. 23A to 23D, after removing the exposed silicon oxide films 29 using ammonium fluoride, CVD (one example of gas-phase or vapor growth) is performed to form an arsenic-doped amorphous silicon film 97 (one example of conductive film) in the etching region 93. This film 97 is designed to have a specified thickness that is large enough to fill a groove R2—for example, a film thickness greater than or equal to the width of R2 (if the width is 200 nm then the thickness is set at 200 nm or more).

Next, as shown in FIGS. 24A–24D, with the etch stopper 89 being left at a portion between neighboring isolating portion formation regions R2, that is, in the device formation region 5, etch-back is applied to the amorphous silicon film 97 (one example of conductive film) by anisotropic etch techniques. Whereby, patterning of back gate lines BGL is accomplished by thinning the amorphous silicon film 97 in each isolating portion formation region R2. In other words, a back gate line BGL for common connection of back gate electrodes 25 is patterned in the etching region 93 along the direction of wordline formation region R1 in such a manner that back gate electrodes 25 are provided through second gate insulation film 27.

Figure 24A:
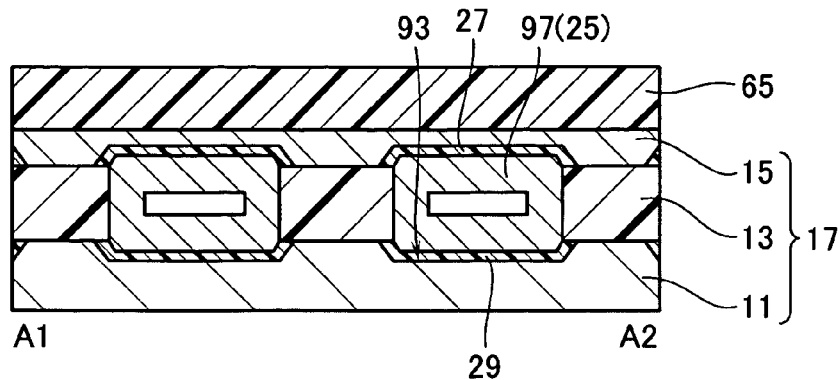
FIG. 24A is a tenth step diagram (A1–A2 cross-section) of the same.
Figure 24B:
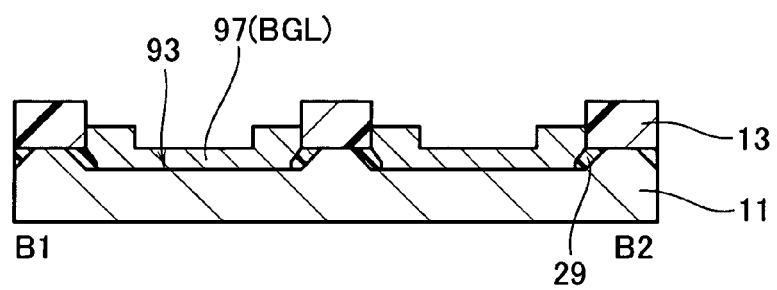
FIG. 24B is a tenth step diagram (B1–B2 cross-section) of the same.
Figure 24C:
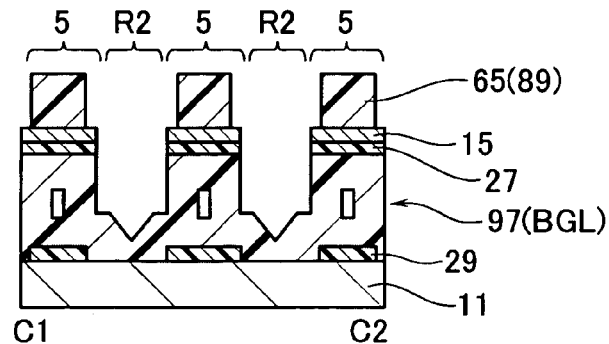
FIG. 24C is a tenth step diagram (C1–C2 cross-section) of the same.

At this patterning step, the film 97 of isolating portion formation region R2 is arranged to be positioned at a specified level lower than the silicon layer 15 (FIG. 24C). Thus it is possible, in any isolation portion to be formed at a later process step, to ensure that its bottom is at a level lower than the silicon layer 15.

Figure 24D:
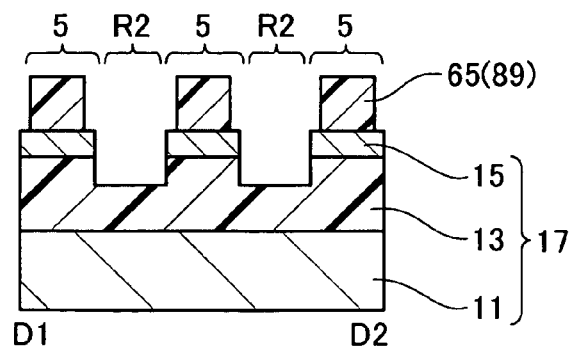
FIG. 24D is a tenth step diagram (D1–D2 cross-section) of the same.
Figure 25A:
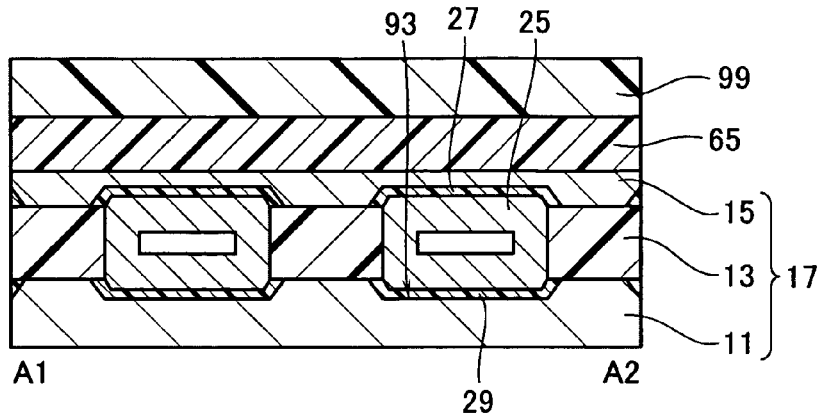
FIG. 25A is an eleventh step diagram (A1–A2 cross-section) of the same.
Figure 25B:
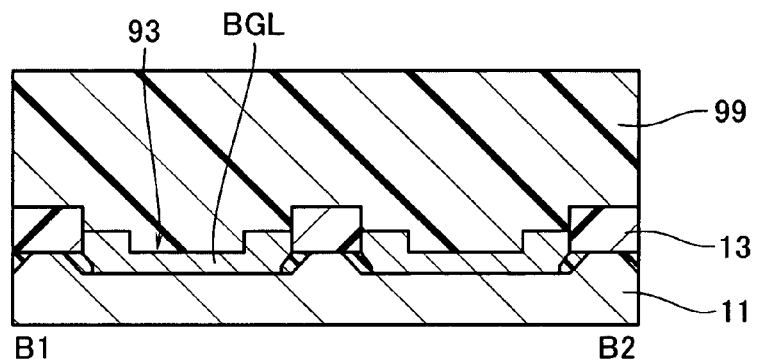
FIG. 25B is an eleventh step diagram (B1–B2 cross-section) of the same.
Figure 25C:
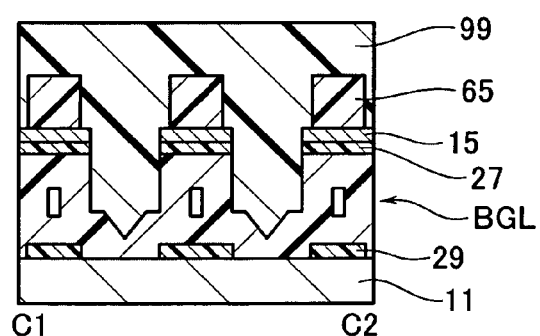
FIG. 25C is an eleventh step diagram (C1–C2 cross-section) of the same.
Figure 25D:
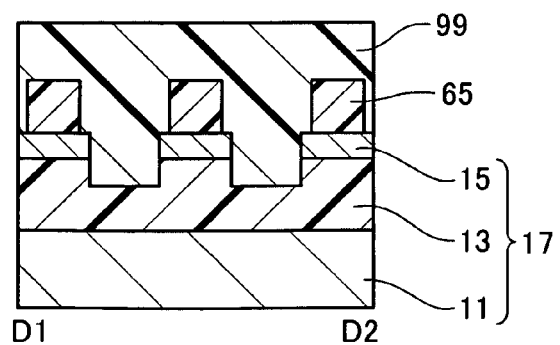
FIG. 25D is an eleventh step diagram (D1–D2 cross-section) of the same.
Figure 26A:
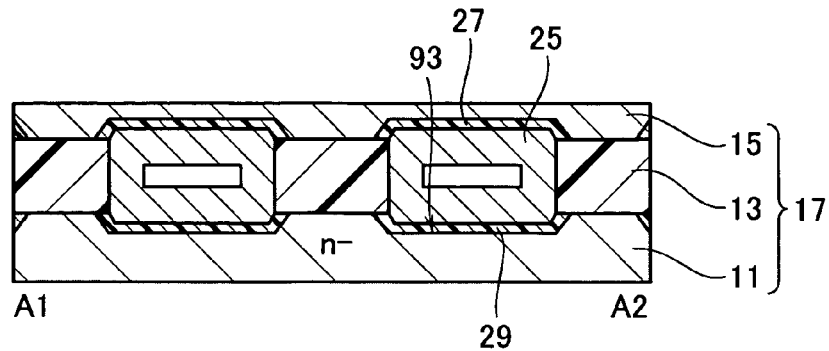
FIG. 26A is a twelfth step diagram (A1–A2 cross-section) of the same.
Figure 26B:
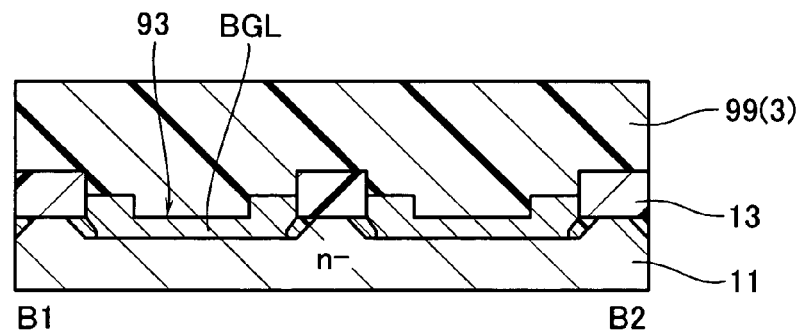
FIG. 26B is a twelfth step diagram (B1–B2 cross-section) of the same.
Figure 26C:
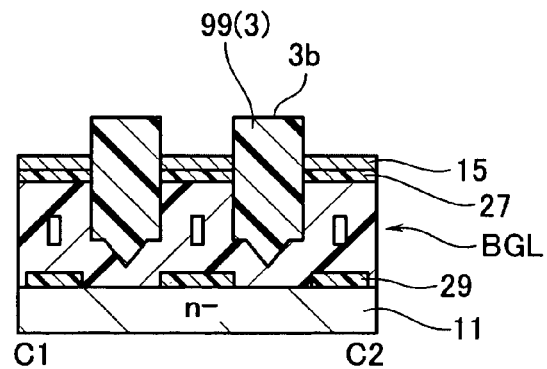
FIG. 26C is a twelfth step diagram (C1–C2 cross-section) of the same.
Figure 26D:
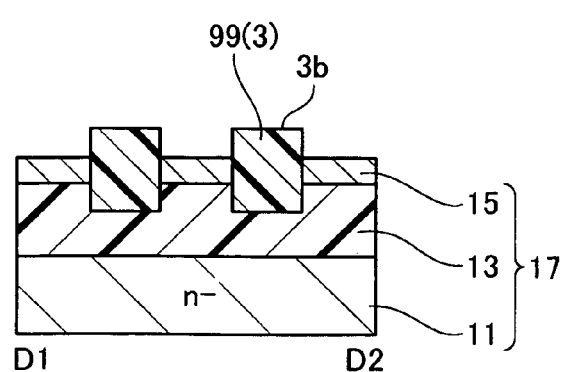
FIG. 26D is a twelfth step diagram (D1–D2 cross-section) of the same.

As shown in FIGS. 24B and 24D, it is made sure that the amorphous silicon layer 97 does not reside on the buried oxide film 13. This ensures that adjacent ones of the back gate lines BGL are separated and isolated from each other. This is a must in cases where an attempt is made to dielectrically isolate back gate lines BGL from silicon substrate 11 while controlling the potential of each back gate line BGL independently of the others. However, in the case of letting back gate lines BGL be common-coupled to silicon substrate 11, it is permissible to make the amorphous silicon film 97 reside on or above the buried oxide film 13.

After completion of the patterning of back gate lines BGL, hot phosphoric acid is used to etch the silicon nitride film 65 until the silicon nitride film 65 on device formation region 5 goes back by about 30 nm.

As shown in FIGS. 25A–25D, a thermal oxide film (not shown) is formed by thermal oxidation on sidewalls of silicon layer 15; thereafter, a silicon oxide film 99 is formed by CVD over an entire surface of the SOI substrate 17 for later use as an isolation portion(s). Next, with the silicon nitride film 65 as a stopper, chemical mechanical polishing (CMP) is performed to thereby planarize the silicon oxide film 99.

Then, as shown in FIGS. 26A–26D, hot phosphoric acid is used to remove the silicon nitride film 65. Thus, isolation portions 3 are formed. An upper part 3b of each isolator 3 is placed at a level higher than the silicon layer 15. Whereby, it is possible to prevent exposure of back gate lines BGL even when the isolator 3 is somewhat peeled off during wet etching at a later process step(s).

After the formation of the isolator portions 3, in order to form an n⁻-type diffusion layer in the silicon substrate 11 of the cell array region, phosphorus ions are implanted thereinto at a dose of $1\times10^{13}$ atoms per square centimeter (/cm²) with application of an acceleration energy of 300 keV. Next, in order to adjust the threshold voltages of memory transistors MT, a chosen impurity is doped into silicon layer 15 by ion implantation. Then, this impurity doped is activated. An alternative approach is to lower the impurity concentration of silicon layer 15 to thereby completely deplete channel bodies 19. In this case also, applying a "minus" voltage with negative polarity to a back gate electrode 25 permits a memory transistor to operate while letting the bottom portion of a channel body 19 be set in an accumulation state.

As shown in FIGS. 2A–2D, by thermal oxidation a first gate insulation film 21 is formed on silicon layer 15. Then, on the first gate insulation film 21 a polycrystalline silicon or "polysilicon" film is formed by CVD techniques, followed by patterning of this polysilicon film. Whereby, word lines WL is formed in a manner such that each is spaced apart from its neighboring ones. More precisely, a front gate electrode 23 is placed via first gate insulation film 21 over part of the silicon layer 15 in which channel body 19 is formed, and a wordline WL for common connection of this electrode 23 is formed in wordline formation region R1.

Thereafter, sidewalls 37 is formed on side faces of front gate electrode 23; then, a drain region 7 and source region 9 are formed in silicon layer 15. A silicon layer is newly formed by selective epitaxial growth on or above a respective one of these regions 7 and 9. Then silicides 33 and 35 are formed. Owing to the presence of new silicon layer, it is possible to force silicide 33 to be spaced apart from second gate insulation film 27. If these are not spaced apart from each other, a leakage current flowable between back gate electrode 25 and drain region 7 (source region 9) can increase in magnitude due to metal atoms behaving to diffuse out of silicide 33.

After having formed an interlayer dielectric film 41 and others, source lines SL are formed that are connected to source regions 9 along the word lines WL while letting each source line be spaced apart from its neighboring ones. Thereafter, bit lines BL are formed that are coupled to drain regions 7 so that these cross or "intersect" the wordlines WL while providing a distance between each bitline and its neighboring ones.

(Modified Layout of Semiconductor Device)

Figure 32:
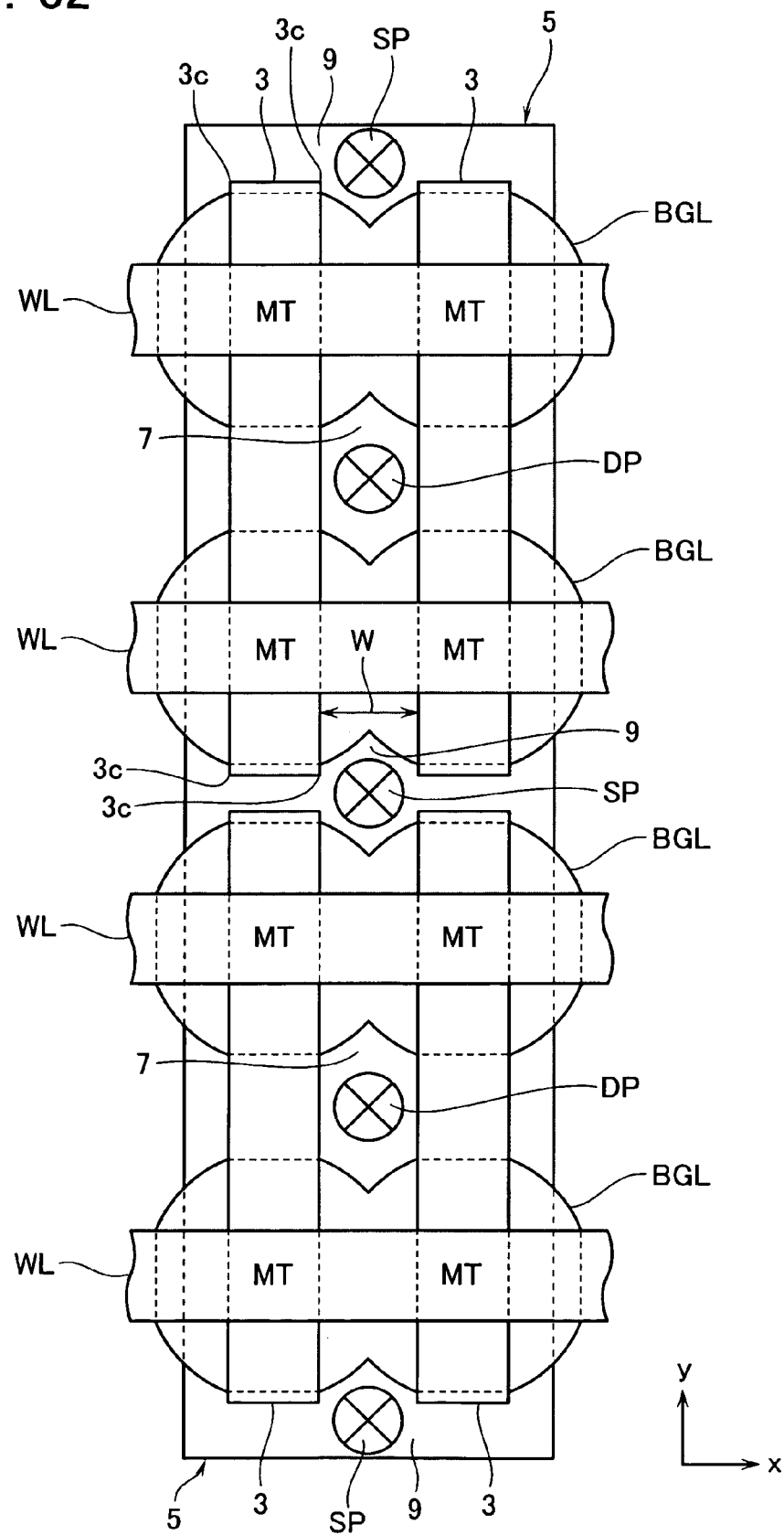
FIG. 32 is a plan view of a modified example of the semiconductor device in accordance with the first embodiment.

Although as shown in FIG. 1 the isolator portion 3 extends continuously in the y direction (crossing direction with word lines WL), the isolator may be segmented. This will be explained as a modified example. FIG. 32 shows a modification of the layout of the semiconductor device in accordance with the first embodiment, which corresponds to FIG. 1. The isolator 3 is segmented per group of two wordlines WL.

However, the layout shown in FIG. 1 is advantageous when compared to the layout of FIG. 32 in two points which follow. A first one of them will be explained below. If a variation in gate width W (FIG. 32) is significant, then the memory transistors MT can experience large variations or fluctuations in threshold voltage and in current value. At a memory transistor MT, a difference between the threshold voltage in the case of data "1" and that in the case of data "0" is utilized for creation of a difference in a read current to thereby perform a data read operation. Accordingly, if a large variation occurs in threshold voltage levels then data read errors can take place in some cases. Even in cases where no appreciable variations occur in threshold levels when the gate width W varies in value, a variation of current values occurs so that the data read margin decreases, resulting in a likewise decrease in manufacturing yield of memory chips.

Since the isolator 3's pattern is rounded at its corner 3c, the gate width W can vary due to this corner rounding. As the isolator 3 of FIG. 1 extends continuously, the resultant number of corners of region 3 becomes less than that of the isolator 3 of FIG. 32. Hence, according to the structure of FIG. 1, it is possible to lessen the variation amount of gate width W so that variations in threshold voltage and current value becomes smaller; thus, data read errors become hardly occurrable.

Next, a second advantage will be explained. As the structure of FIG. 1 is such that the isolator 3 extends continuously like a straight line, the source region 9 is segmented by isolator 3. Consequently, regarding the area of a portion at which a back gate line BGL and source region 9 overlap each other, the structure of FIG. 1 becomes smaller than that of FIG. 32. Thus the structure of FIG. 1 is capable of lessening leakage currents.

[Second Embodiment]

Figure 33:
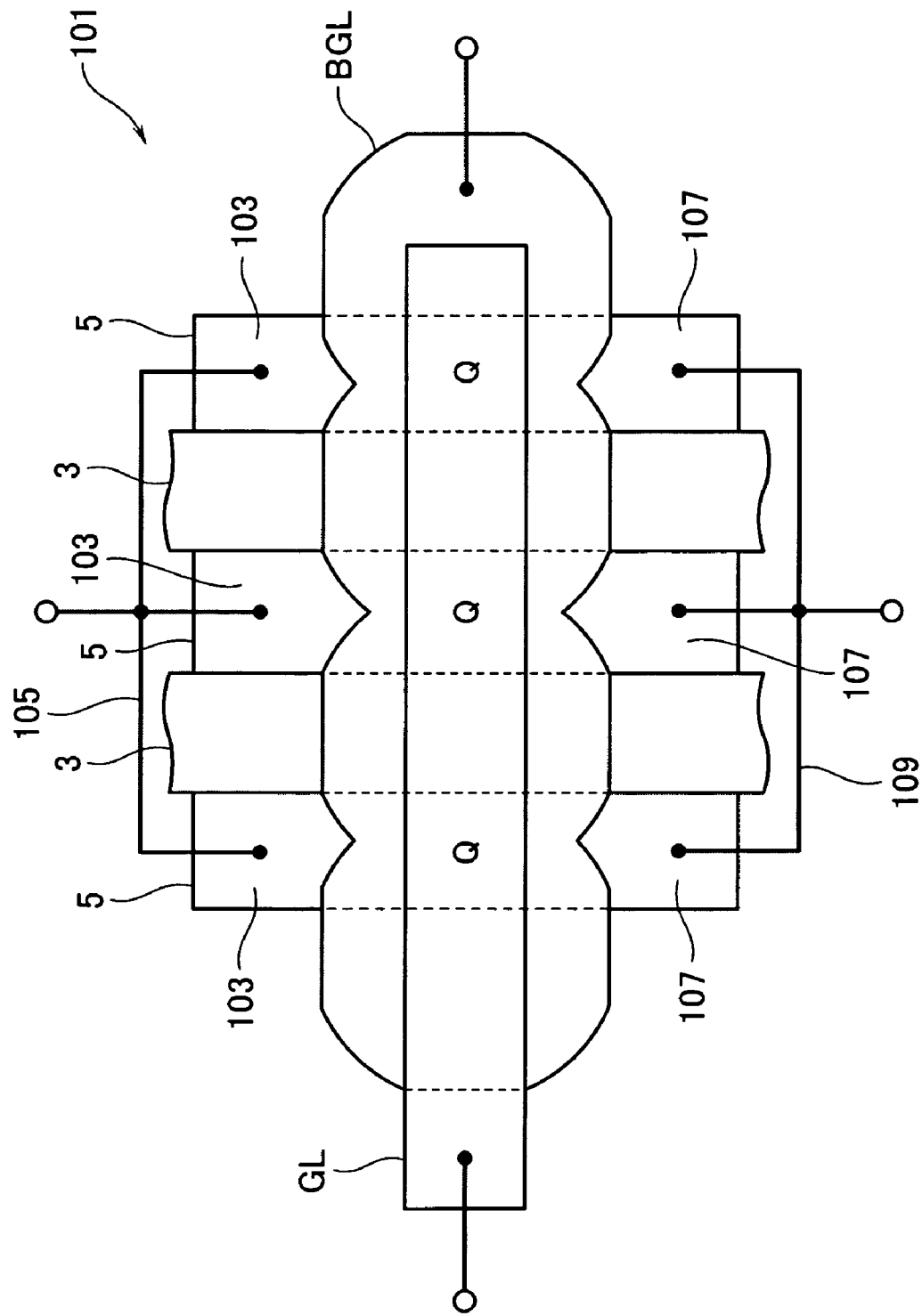
FIG. 33 is a plan view of one example of a semiconductor device in accordance with a second embodiment.

A semiconductor device in accordance with a second embodiment is a transistor 101 making up a logic circuit (referred to hereinafter as a logic transistor). FIG. 33 is a plan view of this transistor 101, which corresponds to FIG. 1. Transistors Q are equivalent to the memory transistors MT of FIG. 1. The logic transistor 101 consists essentially of three transistors Q. Hence, the channel width of a channel body of transistor 101 becomes three times greater than that of a single transistor Q so that it is possible to flow a larger current than the single transistor Q. Thus high-speed operations become attainable.

Explaining in detail the structure of logic transistor 101, respective front gate electrodes of transistors Q are common-coupled together to a single gate line (one example of the first gate line) GL, while respective back gate electrodes are common-coupled to a single back gate line BGL. In addition, certain ones 103 of the source/drain regions of transistors Q are common-coupled to a wiring layer 105, whereas the remaining source/drain regions 107 are common-coupled to a wiring layer 109. Note here that the source/drain region as used herein refers to a region which functions as at least one of a source region and a drain region. The semiconductor device in accordance with the second embodiment is similar to the first embodiment both in cross-sectional structure and in fabrication method.

Fixing or "pinning" the potential of back gate line BGL makes it possible to suppress unwanted expansion of an electric field at the drain. Thus it is possible to lessen the influenceability of short-channel effects in the logic transistor 101. For the same reasons as those discussed in conjunction with the first embodiment, it is possible for the second embodiment also to reduce leakage currents owing to the use of a structure with the bottom of an isolator being placed at a level lower than the channel body. Another advantage of it lies in an ability to lessen the sizes of transistors Q while enabling reduction of parasitic capacitances, by letting the gate length of each back gate electrode be greater than a onefold value of the gate length of each front gate electrode and yet less than or equal to thrice the front gate length. Using the structure for thinning the channel body only makes it possible to reduce both the junction capacitance and the parasitic resistance. Owing to these advantages in the logic transistor stated above, it is possible to realize logic circuitry offering high-speed operability with low power consumption.

It should be noted that the number of the transistors Q making up the logic transistor 101 is not limited to three and may be determined in view of the characteristics required for the logic transistor.

Figure 34:
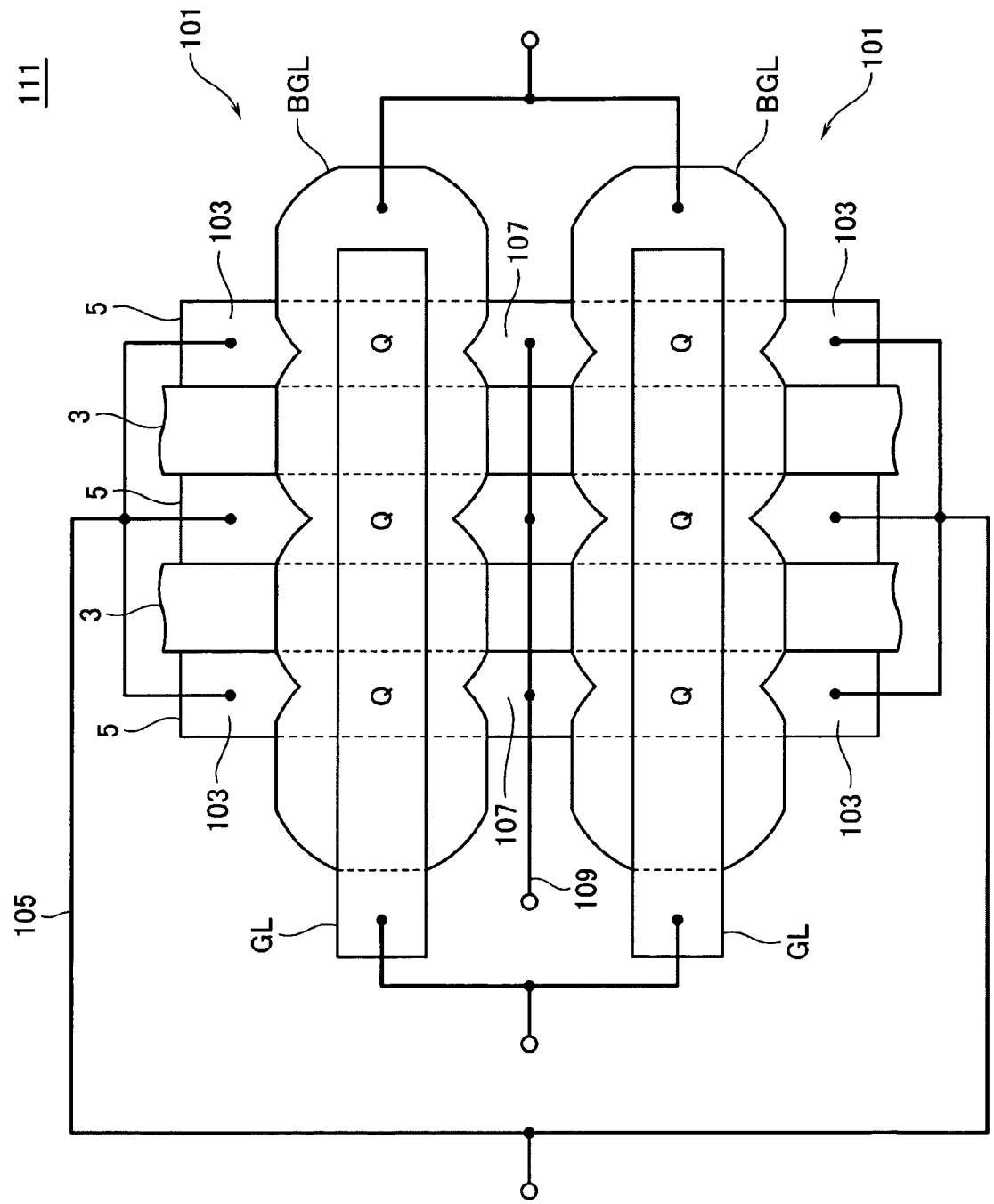
FIG. 34 is a plan view of another example of the semiconductor device in accordance with the second embodiment.

Also note that the second embodiment is modifiable so that the gate line GL and back gate line BGL are each provided to have a stripe-like shape. FIG. 34 is a plan view of this structure, which corresponds to FIG. 33. A logic transistor 111 of FIG. 34 has a structure with a parallel combination of two logic transistors, each of which is the same as the logic transistor 101 of FIG. 33. More precisely explaining, one and the other of the transistors 101 share source/drain regions 107. In addition, ones and the others of source/drain regions 103 of transistors 101 are common-coupled together to a wiring layer 105. One and the other of gate lines GL of the transistors 101 are connected together, while back gate lines BGL are coupled together. With such an arrangement, a single logic transistor 111 is made up of six transistors Q.

It has been stated that according to the present invention, it is possible to lessen the size of a semiconductor device.

What is claimed is:

1. A semiconductor device comprising:
   a substrate;
   a semiconductor layer of a first conductivity type having a single-crystal structure;
   a plurality of transistors each including a first gate electrode provided above said semiconductor layer with a first gate insulation film laid therebetween, a pair of impurity regions of a second conductivity type being provided in said semiconductor layer and becoming a drain region and a source region, and a channel body of the first conductivity type provided in said semiconductor layer at a portion between these impurity regions;
   a first gate line for common connection of the first gate electrodes of said plurality of transistors;
   a dielectric layer provided above said substrate in an extension direction of said first gate line, for supporting said semiconductor layer under said pair of impurity regions to thereby dielectrically isolate between said substrate and said semiconductor layer;
   a second gate electrode provided above said substrate in such a manner as to underlie the channel bodies of said plurality of transistors and oppose said channel bodies with a second gate insulation film laid therebetween, said second gate electrode having a gate length larger than a onefold value of a gate length of said first gate electrode and yet less than or equal to thrice the gate length; and
   a second gate line provided above said substrate along the extension direction of said first gate line while being placed between portions of said dielectric layer underlying said pair of impurity regions, said second gate line being for common connection of a plurality of said second gate electrodes.

2. The device according to claim 1, wherein said first gate line includes a word line and wherein said plurality of transistors include memory transistors each being for storing data based on a majority carrier accumulation state of said channel body.

3. The device according to claim 2, further comprising:
an isolation portion for insulative isolation between adjacent ones of said memory transistors, said isolation portion having a bottom positioned at a lower level than said semiconductor layer.

4. The device according to claim 2, further comprising:
an isolation portion continuously formed in a direction for intersection with said word line, for dielectrically isolating between adjacent ones of said memory transistors.

5. The device according to claim 2, further comprising:
an isolation portion for insulative isolation between adjacent ones of said memory transistors, wherein said second gate line is connected to said substrate at a location underlying said isolation portion.

6. The device according to claim 5, further comprising:
a plug as connected through said substrate to said second gate line.

7. The device according to claim 2, further comprising:
a plug dielectrically isolated from said substrate and connected to said second gate line.

8. The device according to claim 2, wherein said semiconductor layer is such that a formation region of said channel body is less in thickness than a formation region of said impurity region.

9. The device according to claim 2, wherein a bit line crossing said word line is connected to said drain region, and wherein a source line provided along an extension direction of said word line is connected to said source region.

10. The device according to claim 2, wherein a logic circuit using transistors formed at said semiconductor layer as its constituent elements is mounted together on said substrate.

11. The device according to claim 10, wherein said semiconductor layer is such that a formation region of said logic circuit is greater in thickness than a formation region of each said memory transistor.

12. The device according to claim 2, wherein each of said plurality of memory transistors stores any one of a first data state in which said channel body retains a certain amount of majority carriers and a second data state in which said channel body retains majority carriers less in amount than those in the first data state.

13. The device according to claim 1, further comprising:
a logic transistor arranged by connecting together one of said pair of impurity regions of said plurality of transistors while connecting together remaining ones of the pairs of impurity regions.

14. The device according to claim 13, wherein a plurality of first gate lines each similar to said first gate line and a plurality of second gate lines each similar to said second gate line are provided to have stripe shapes respectively.

15. A semiconductor device comprising:
a substrate;
a semiconductor layer of a first conductivity type having a single-crystal structure;
a plurality of transistors each including a first gate electrode provided above said semiconductor layer with a first gate insulation film laid therebetween, a pair of impurity regions of a second conductivity type being provided in said semiconductor layer and becoming a drain region and a source region, and a channel body of the first conductivity type provided in said semiconductor layer at a portion between these impurity regions;
a first gate line for common connection of the first gate electrodes of said plurality of transistors;
a dielectric layer provided above said substrate in an extension direction of said first gate line, for supporting said semiconductor layer under said pair of impurity regions to thereby dielectrically isolate between said substrate and said semiconductor layer;
a second gate electrode provided above said substrate in such a manner as to underlie the channel bodies of said plurality of transistors and oppose said channel bodies with a second gate insulation film laid therebetween;
a second gate line provided above said substrate along the extension direction of said first gate line while being placed between portions of said dielectric layer underlying said pair of impurity regions, said second gate line being for common connection of a plurality of said second gate electrodes; and
an isolation portion for insulative isolation between adjacent ones of said transistors, said isolation portion having a bottom positioned at a lower level than said semiconductor layer.

16. A semiconductor device comprising:
a substrate;
a semiconductor layer of a first conductivity type having a single-crystal structure;
a plurality of transistors each including a first gate electrode provided above said semiconductor layer with a first gate insulation film laid therebetween, a pair of impurity regions of a second conductivity type being provided in said semiconductor layer and becoming a drain region and a source region, and a channel body of the first conductivity type provided in said semiconductor layer at a portion between these impurity regions;
a first gate line for common connection of the first gate electrodes of said plurality of transistors;
a dielectric layer provided above said substrate in an extension direction of said first gate line, for supporting said semiconductor layer under said pair of impurity regions to thereby dielectrically isolate between said substrate and said semiconductor layer;
a second gate electrode provided above said substrate in such a manner as to underlie the channel bodies of said plurality of transistors and oppose said channel bodies with a second gate insulation film laid therebetween; and
a second gate line provided above said substrate along the extension direction of said first gate line while being placed between portions of said dielectric layer underlying said pair of impurity regions, said second gate line being for common connection of a plurality of said second gate electrodes,
wherein said semiconductor layer is such that a formation region of said channel body is less in thickness than a formation region of said impurity region.

* * * * *